US012776628B2

(12) United States Patent
Okamura

(10) Patent No.: US 12,776,628 B2
(45) Date of Patent: Oct. 27, 2026

(54) SEMICONDUCTOR DEVICE

(71) Applicant: Sony Semiconductor Solutions Corporation, Kanagawa (JP)

(72) Inventor: Takanori Okamura, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 813 days.

(21) Appl. No.: 18/030,631

(22) PCT Filed: Sep. 29, 2021

(86) PCT No.: PCT/JP2021/035810
§ 371 (c)(1),
(2) Date: Apr. 6, 2023

(87) PCT Pub. No.: WO2022/107454
PCT Pub. Date: May 27, 2022

(65) Prior Publication Data

US 2023/0369830 A1 Nov. 16, 2023

(30) Foreign Application Priority Data

Nov. 19, 2020 (JP) ................................ 2020-192546

(51) Int. Cl.
*H01S 5/42* (2006.01)
*H01S 5/02315* (2021.01)
(Continued)

(52) U.S. Cl.
CPC .......... *H01S 5/423* (2013.01); *H01S 5/02315* (2021.01); *H01S 5/0234* (2021.01);
(Continued)

(58) Field of Classification Search
CPC .... H01S 5/4018; H01S 5/423; H01S 5/18305; H01S 5/02315; H01S 5/0234; H01S 5/0239
See application file for complete search history.

(56) References Cited

U.S. PATENT DOCUMENTS

2013/0163626 A1* 6/2013 Seurin .................... F21V 29/74 372/36
2015/0071320 A1* 3/2015 Gronenborn ............ H01S 5/183 438/27
(Continued)

FOREIGN PATENT DOCUMENTS

JP 2003-045989 A 2/2003
JP 2004-526194 A 8/2004
(Continued)

OTHER PUBLICATIONS

International Search Report issued in International Patent Application No. PCT/JP2021/035810 on Dec. 21, 2021 and English translation of same. 5 pages.
Written Opinion issued in International Patent Application No. PCT/JP2021/035810 on Dec. 21, 2021. 3 pages.

*Primary Examiner* — James A Menefee
(74) *Attorney, Agent, or Firm* — K&L Gates LLP

(57) ABSTRACT

Provided is a semiconductor device capable of easily reducing parasitic capacitance between wirings.
A semiconductor device according to the present disclosure includes a first substrate, a lower wiring provided on the first substrate, a plurality of upper wirings provided on the lower wiring via an insulation film, and a second substrate provided on the upper wirings via a plurality of elements, in which the upper wirings include a first wiring and a second wiring adjacent to each other in a first direction, the elements on the first wiring and the elements on the second wiring are connected in series to each other, and a first opening is provided in the lower wiring or provided so as to be
(Continued)

sandwiched between the lower wirings in a second direction different from the first direction, or a second opening is provided in the upper wirings or provided so as to be sandwiched between the upper wirings in the second direction.

19 Claims, 16 Drawing Sheets

(51) Int. Cl.

| | |
|---|---|
| ***H01S 5/0234*** | (2021.01) |
| ***H01S 5/0239*** | (2021.01) |
| ***H01S 5/183*** | (2006.01) |
| ***H01S 5/40*** | (2006.01) |

(52) U.S. Cl.

CPC .......... *H01S 5/0239* (2021.01); *H01S 5/4018* (2013.01); *H01S 5/18305* (2013.01)

(56) References Cited

U.S. PATENT DOCUMENTS

| | | | | |
|---|---|---|---|---|
| 2017/0033535 | A1* | 2/2017 | Joseph | H01S 5/18341 |
| 2017/0170799 | A1 | 6/2017 | Kong et al. | |
| 2019/0036308 | A1* | 1/2019 | Carson | H01S 5/0237 |
| 2020/0014169 | A1* | 1/2020 | Yu | H01S 5/0203 |
| 2020/0169065 | A1* | 5/2020 | Carson | H01S 5/423 |
| 2021/0104873 | A1* | 4/2021 | Gerlach | H01S 5/423 |
| 2021/0167572 | A1* | 6/2021 | Tabata | G01C 3/06 |
| 2021/0408768 | A1* | 12/2021 | Wang | H01S 5/18361 |

FOREIGN PATENT DOCUMENTS

| | | | |
|---|---|---|---|
| JP | 2007266575 | A | 10/2007 |
| JP | 2019-067805 | A | 4/2019 |
| JP | 2020-038855 | A | 3/2020 |

* cited by examiner

A

B

A

B

C

A

B

C

A

B

SEMICONDUCTOR DEVICE

TECHNICAL FIELD

The present disclosure relates to a semiconductor device.

BACKGROUND ART

As a type of semiconductor laser, a surface-emitting laser such as a vertical cavity surface emitting laser (VCSEL) is known. In general, in a light emitting device utilizing a surface-emitting laser, a plurality of light emitting elements is provided in a two-dimensional array on a front surface or a back surface of a substrate.

CITATION LIST

Patent Document

Patent Document 1: Japanese Unexamined Patent Application No. 2004-526194
Patent Document 2: Japanese Patent Application Laid-Open No. 2003-045989

SUMMARY OF THE INVENTION

Problems to be Solved by the Invention

There are cases where a semiconductor device such as a light emitting device includes a lower wiring, an insulation film, and an upper wiring in this order on a substrate. For example, a light emitting device may be manufactured by forming a plurality of light emitting elements on a certain substrate, forming a lower wiring, an insulation film, and an upper wiring in this order on another substrate, and mounting the former substrate on the latter substrate.

For such a semiconductor device, it is possible to reduce parasitic capacitance between the lower wiring and the upper wiring by providing a cavity in the insulation film between the lower wiring and the upper wiring. However, it is difficult to provide a cavity in the insulation film. Therefore, it is desirable that the parasitic capacitance between these wirings can be easily reduced.

Therefore, the present disclosure provides a semiconductor device capable of easily reducing parasitic capacitance between wirings.

Solutions to Problems

A semiconductor device according to a first aspect of the present disclosure includes a first substrate, a lower wiring provided on the first substrate, a plurality of upper wirings provided on the lower wiring via an insulation film, and a second substrate provided on the upper wirings via a plurality of elements, in which the upper wirings include a first wiring and a second wiring adjacent to each other in a first direction, the elements on the first wiring and the elements on the second wiring are connected in series to each other, and a first opening is provided in the lower wiring or provided so as to be sandwiched between the lower wirings in a second direction different from the first direction, or a second opening is provided in the upper wirings or provided so as to be sandwiched between the upper wirings in the second direction. Hence, for example, it is possible to easily reduce parasitic capacitance between the wirings by providing the first opening in the lower wiring or between the lower wirings, or by providing the second opening in the upper wirings or between the upper wirings.

Furthermore, in the first aspect, the elements on the first wiring may be connected in parallel to each other, and the elements on the second wiring may be connected in parallel to each other. Hence, for example, it is possible to connect the elements in parallel on the first wiring and on the second wiring, while connecting the elements in series between the first wiring and the second wiring.

Furthermore, in the first aspect, the elements may be light emitting elements provided on the second substrate. Hence, for example, it is possible to easily reduce parasitic capacitance between the wirings in a light emitting device.

Furthermore, in the first aspect, light emitted from the light emitting elements may pass through the second substrate from a lower surface to upper surface of the second substrate, and may be emitted from the second substrate. Hence, for example, it is possible to easily reduce parasitic capacitance between the wirings in a back-side emission type light emitting device.

Furthermore, in the first aspect, the lower wiring may be used such that current flows in the first direction, and the upper wirings may be used such that current flows in a direction opposite to the first direction. Hence, for example, it is possible to cause a magnetic field generated around the upper wirings and a magnetic field generated around the lower wiring to cancel each other out.

Furthermore, in the first aspect, an opening extending in the first direction may be provided as the first or second opening. Hence, for example, it is possible to implement a structure in which current easily flows in the first direction in the lower wiring even if the first opening is provided, or a structure in which current easily flows in the direction opposite to the first direction in the upper wirings even if the second opening is provided.

Furthermore, in the first aspect, a plurality of openings extending in the first direction and adjacent to each other in the second direction may be provided as the first or second openings. Hence, for example, it is possible to implement a structure in which current easily flows in the first direction in the lower wiring even if a plurality of openings is provided as the first openings, or a structure in which current easily flows in the direction opposite to the first direction in the upper wirings even if a plurality of openings is provided as the second openings.

Furthermore, in the first aspect, the lower wiring or the upper wirings may include a plurality of first parts extending in the first direction and a plurality of second parts extending in the second direction, and each of the plurality of openings may be provided between the first parts adjacent to each other in the second direction. Hence, for example, it is possible to implement a structure in which current easily flows in the first direction even if a plurality of openings is provided in one lower wiring, or a structure in which current easily flows in the direction opposite to the first direction even if a plurality of openings is provided in one upper wiring.

Furthermore, in the first aspect, a width of the upper wirings in the second direction may be the same as a width of the lower wiring in the second direction. Hence, for example, it is possible to cause a magnetic field generated around the upper wirings and a magnetic field generated around the lower wiring to suitably cancel each other out.

Furthermore, in the first aspect, a width of the upper wirings in the second direction may be wider than a width of the lower wiring in the second direction.

Hence, for example, it is possible to implement a structure suitable as compared with a case where the width of the upper wirings in the second direction is narrower than the width of the lower wiring in the second direction.

Furthermore, in the first aspect, a width of the upper wirings in the second direction may be 90% to 110% of a width of the lower wiring in the second direction. Hence, for example, it is possible to obtain substantially the same effect as in a case where these widths are the same.

Furthermore, in the first aspect, the first opening may be provided in the lower wiring or provided so as to be sandwiched between the lower wirings in the second direction, and the second opening may be provided in the upper wirings or provided so as to be sandwiched between the upper wirings in the second direction. Hence, for example, it is possible to increase a degree of freedom in designing the wiring as compared with a case where only either the first opening or the second opening is provided.

Furthermore, in the first aspect, the first opening may be provided at a position facing the upper wirings vertically, and the second opening may be provided at a position facing the lower wiring vertically. Hence, for example, it is possible to further reduce parasitic capacitance between the wirings.

Furthermore, in the first aspect, a plurality of openings extending in the first direction may be provided as the first opening, the lower wiring may include a plurality of first parts extending in the first direction and a plurality of second parts extending in the second direction, and each of the plurality of openings may be provided between the first parts adjacent to each other in the second direction. Hence, for example, it is possible to implement a structure in which current easily flows in the first direction in the lower wiring even if a plurality of openings is provided as the first openings.

Furthermore, in the first aspect, a plurality of openings extending in the first direction may be provided as the second openings, and each of the plurality of openings may be provided between the upper wirings adjacent to each other in the second direction. Hence, for example, it is possible to implement a structure in which current easily flows in a direction opposite to the first direction in the upper wirings even if a plurality of openings is provided as the second openings.

Furthermore, in the first aspect, a width of the first or second opening in the second direction may be one tenth or less of a width of the upper wirings in the second direction. Hence, for example, it is possible to further reduce parasitic capacitance between the wirings.

Furthermore, in the first aspect, the plurality of first parts may include first parts having different widths in the second direction. Hence, for example, it is possible to increase a degree of freedom in designing wirings as compared with a case where the widths of all the first parts in the second direction are the same.

Furthermore, in the first aspect, a plurality of openings disposed in a two-dimensional array may be provided as the first or second opening. Hence, for example, it is possible to reduce parasitic capacitance between the wirings by using a large number of openings.

Furthermore, in the first aspect, as the first or second opening, only one opening may be provided in the upper wirings or in the lower wiring, or only one opening may be provided so as to be sandwiched between the upper wirings in the second direction or between the lower wirings in the second direction. Hence, for example, it is possible to reduce parasitic capacitance between the wirings by using one opening.

Furthermore, in the first aspect, the first substrate may include a semiconductor substrate including silicon (Si), and the second substrate may include a semiconductor substrate including gallium (Ga) and arsenic (As). Hence, for example, it is possible to provide a circuit on an inexpensive Si substrate with the elements provided on a high-performance GaAs substrate.

MODES FOR CARRYING OUT THE INVENTION

Hereinafter, embodiments according to the present disclosure will be described with reference to the drawings.

First Embodiment

Figure 1:
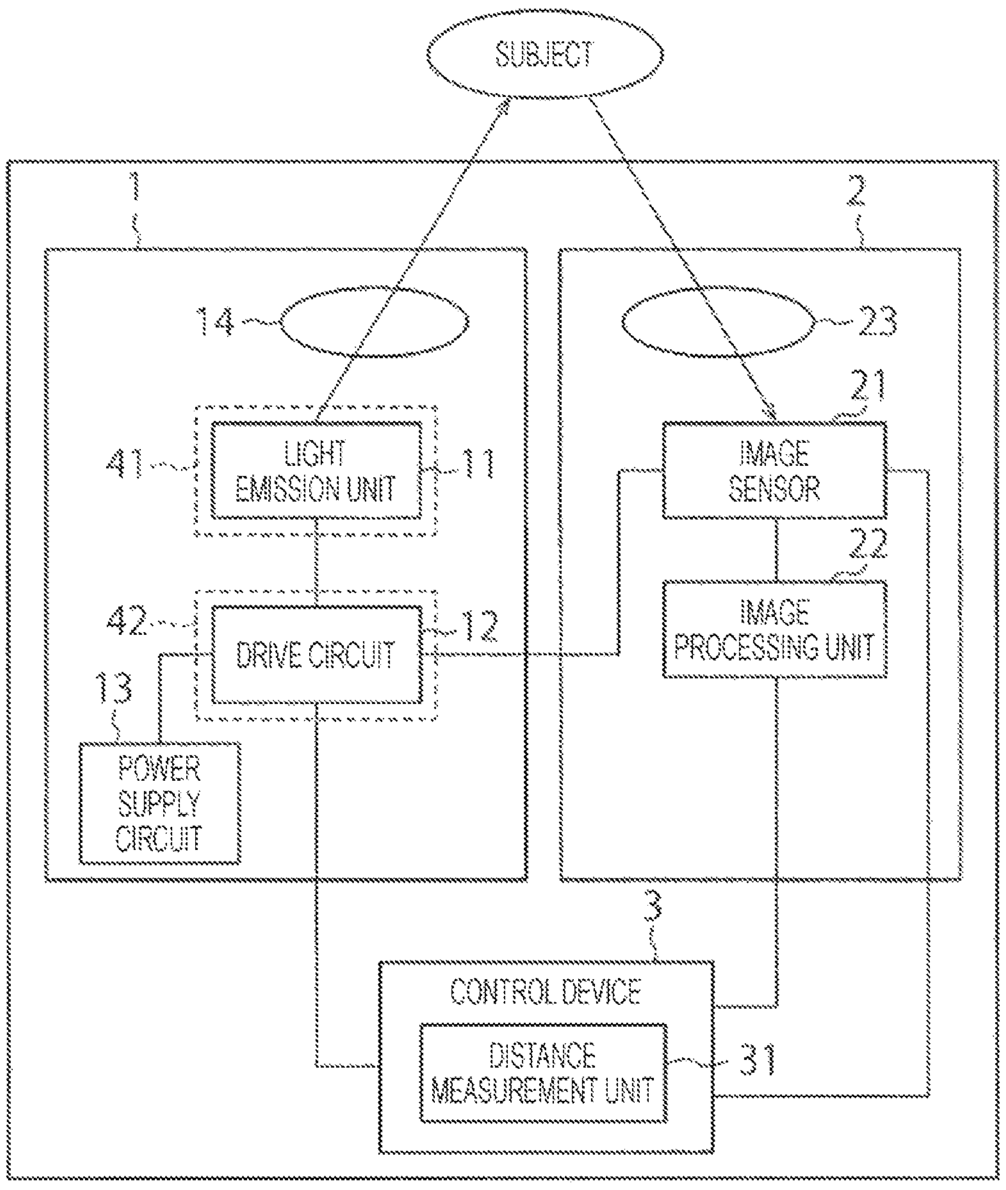
FIG. 1 is a block diagram illustrating a configuration of a distance measurement device of a first embodiment.

FIG. 1 is a block diagram illustrating a configuration of a distance measurement device of a first embodiment.

The distance measurement device in FIG. 1 includes a light emitting device 1, an imaging device 2, and a control device 3. The distance measurement device in FIG. 1 irradiates a subject with light emitted from the light emitting device 1. The imaging device 2 receives light reflected by the subject and captures an image of the subject. The control device 3 measures (calculates) a distance to the subject by using an image signal output from the imaging device 2. The light emitting device 1 functions as a light source for the imaging device 2 to capture the image of the subject.

The light emitting device 1 includes a light emission unit 11, a drive circuit 12, a power supply circuit 13, and a light-emitting side optical system 14. The imaging device 2 includes an image sensor 21, an image processing unit 22, and an imaging-side optical system 23. The control device 3 includes a distance measurement unit 31.

The light emission unit 11 emits laser light for irradiating the subject. As will be described later, the light emission unit 11 of the present embodiment includes a plurality of light emitting elements disposed in a two-dimensional array, and each light emitting element has a vertical-cavity surface-emitting laser (VCSEL) structure. The subject is irradiated with light emitted from these light emitting elements. As illustrated in FIG. 1, the light emission unit 11 of the present embodiment is provided in a chip referred to as a laser diode (LD) chip 41.

The drive circuit 12 is an electric circuit that drives the light emission unit 11. The power supply circuit 13 is an electric circuit that generates power supply voltage of the drive circuit 12. In the distance measurement device in FIG. 1, for example, the power supply circuit 13 generates power supply voltage from input voltage supplied from a battery in the distance measurement device, and the drive circuit 12 drives the light emission unit 11 by using the power supply voltage. As illustrated in FIG. 1, the drive circuit 12 of the present embodiment is provided in a substrate called a laser diode driver (LDD) board 42.

The light-emitting side optical system 14 includes various optical elements, and irradiates the subject with light from the light emission unit 11 via these optical elements. Similarly, the imaging-side optical system 23 includes various optical elements, and receives light from the subject via these optical elements.

The image sensor 21 receives the light from the subject via the imaging-side optical system 23, and converts the light into an electric signal by photoelectric conversion. The image sensor 21 is, for example, a charge-coupled device (CCD) sensor or a complementary metal-oxide semiconductor (CMOS) sensor. The image sensor 21 of the present embodiment converts the above-described electronic signal from an analog signal to a digital signal with analog to digital (A/D) conversion, and outputs an image signal as a digital signal to the image processing unit 22. Furthermore, the image sensor 21 of the present embodiment outputs a frame synchronization signal to the drive circuit 12, and the drive circuit 12 causes the light emission unit 11 to emit light at a timing corresponding to a frame period in the image sensor 21 on the basis of the frame synchronization signal.

The image processing unit 22 performs various types of image processing on the image signal output from the image sensor 21. The image processing unit 22 includes, for example, an image processing processor such as a digital signal processor (DSP).

The control device 3 controls various operations of the distance measurement device in FIG. 1, and controls, for example, light emitting operation by the light emitting device 1 or imaging operation by the imaging device 2. The control device 3 includes, for example, a central processing unit (CPU), a read-only memory (ROM), a random access memory (RAM), and the like.

The distance measurement unit 31 measures the distance to the subject on the basis of the image signal output from the image sensor 21 and subjected to the image processing by the image processing unit 22. The distance measurement unit 31 employs, for example, a µmethod as a distance measurement method. The distance measurement unit 31 may further measure a distance between the distance measurement device and the subject for each portion of the subject on the basis of the above-described image signal to identify a three-dimensional shape of the subject.

Figure 2:
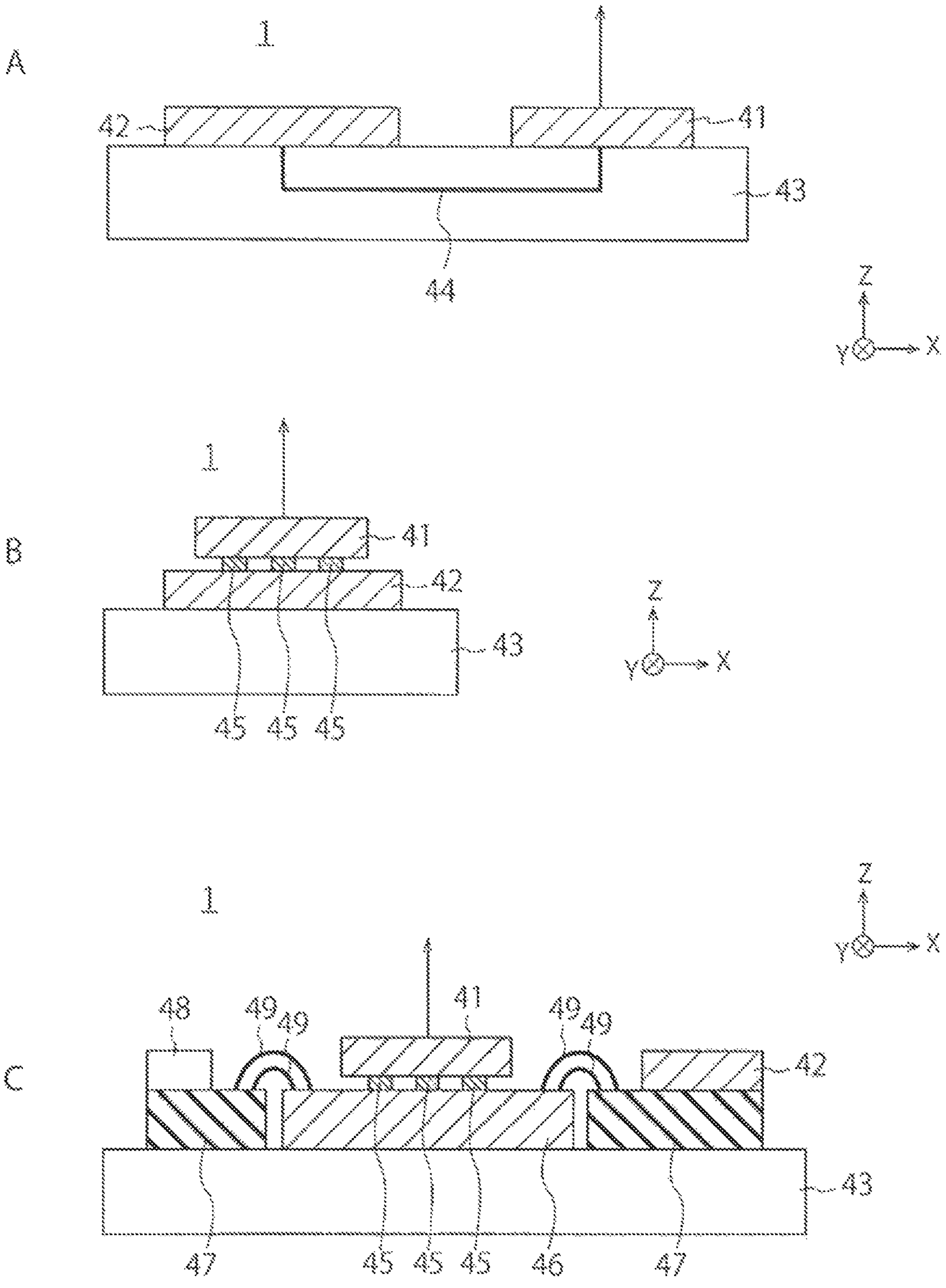
FIG. 2 is a cross-sectional view illustrating an example of a structure of a light emitting device 1 of the first embodiment.

FIG. 2 is a cross-sectional view illustrating an example of a structure of the light emitting device 1 of the first embodiment.

A of FIG. 2 illustrates a first example of the structure of the light emitting device 1 of the present embodiment. The light emitting device 1 of this example includes the above-described LD chip 41 and LDD board 42, a mounting board 43, and a wiring 44.

A of FIG. 2 illustrates an X axis, a Y axis, and a Z axis perpendicular to each other. An X direction and a Y direction correspond to a lateral direction (horizontal direction), and a Z direction corresponds to a longitudinal direction (vertical direction). Furthermore, a +Z direction corresponds to an upward direction, and a −Z direction corresponds to a downward direction. The −Z direction may exactly match a gravity direction, or may not exactly match the gravity direction. The X direction is an example of a first direction according to the present disclosure, and the Y direction is an example of a second direction according to the present disclosure.

In A of FIG. 2, light is emitted from the LD chip 41 in the +Z direction. Both the LD chip 41 and the LDD board 42 are disposed on the mounting board 43. The mounting board 43 is, for example, a printed board. The image sensor 21 and image processing unit 22 in FIG. 1 are also disposed on the mounting board 43 of the present embodiment.

The wiring 44 is provided on a front surface, back surface, inside, or the like of the mounting board 43, and electrically connects the LD chip 41 and the LDD board 42. The wiring 44 is, for example, a printed wiring provided on the front surface or back surface of the mounting board 43, or a via interconnection penetrating the mounting board 43.

B of FIG. 2 illustrates a second example of the structure of the light emitting device 1 of the present embodiment. The light emitting device 1 of this example includes components identical to the components of the light emitting device 1 of the first example, but includes a bump 45 instead of the wiring 44.

In B of FIG. 2, the LDD board 42 is disposed on the mounting board 43, and the LD chip 41 is disposed on the LDD board 42. By disposing the LD chip 41 on the LDD board 42 in this manner, it is possible to reduce a size of the mounting board 43 as compared with a case of the first example. In B of FIG. 2, the LD chip 41 is disposed on the LDD board 42 via the bump 45, and is electrically connected to the LDD board 42 by the bump 45. The bump 45 is formed by, for example, gold (Au).

C of FIG. 2 illustrates a third example of the structure of the light emitting device 1 of the present embodiment. The light emitting device 1 of this example includes a circuit board 46, an insulating substrate 47, a capacitor 48, and bonding wires 49 in addition to components identical to the components of the light emitting device 1 of the second example.

In C of FIG. 2, the circuit board 46 and the insulating substrate 47 are disposed on the mounting board 43, the LD chip 41 is disposed on the circuit board 46, and the LDD board 42 and the capacitor 48 are disposed on the insulating substrate 47. Furthermore, the LD chip 41 is disposed on the circuit board 46 via the bump 45, and is electrically connected to wiring (not illustrated) in the circuit board 46 by the bump 45. Moreover, the LDD board 42 and the capacitor 48 are electrically connected to wiring in the circuit board 46 via wiring (not illustrated) in the insulating substrate 47 and the bonding wires 49. Details of the wiring in the circuit board 46 and the wiring in the insulating substrate 47 will be described later.

Hereinafter, the light emitting device 1 of the present embodiment will be described as having the structure of the third example illustrated in C of FIG. 2. However, except for description of a structure specific to the third example, the following description is also applicable to the light emitting device 1 having the structure of the first or second example.

Figure 3:
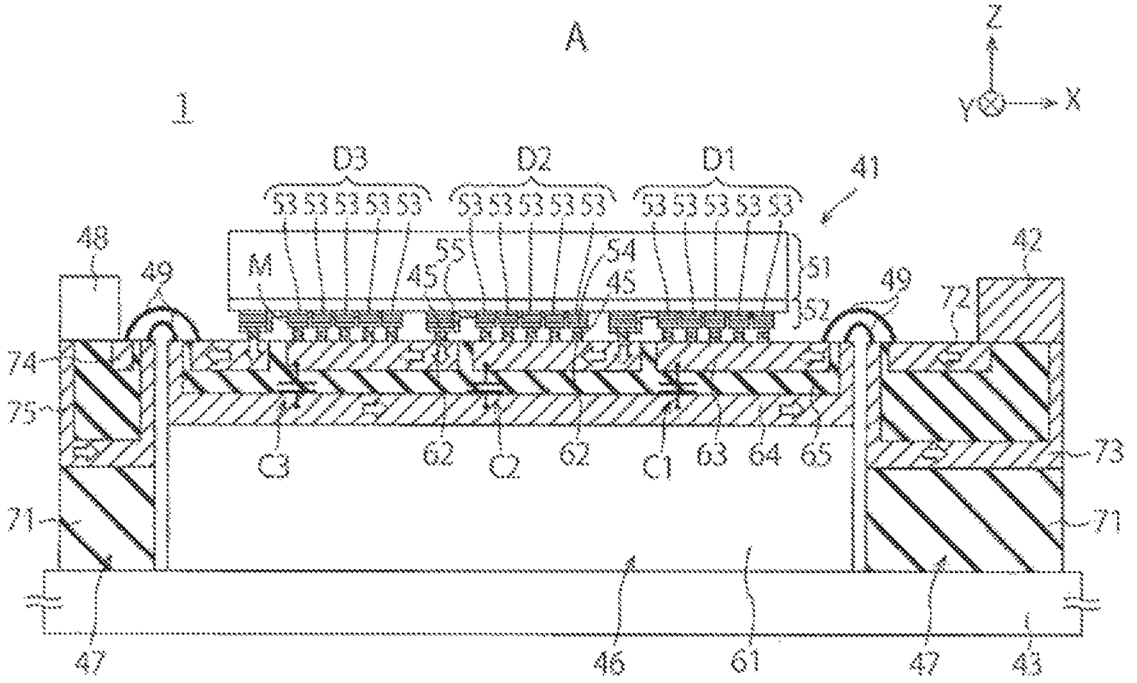
FIG. 3 is a cross-sectional view illustrating the structure of the light emitting device 1 of the first embodiment.
Figure 3:
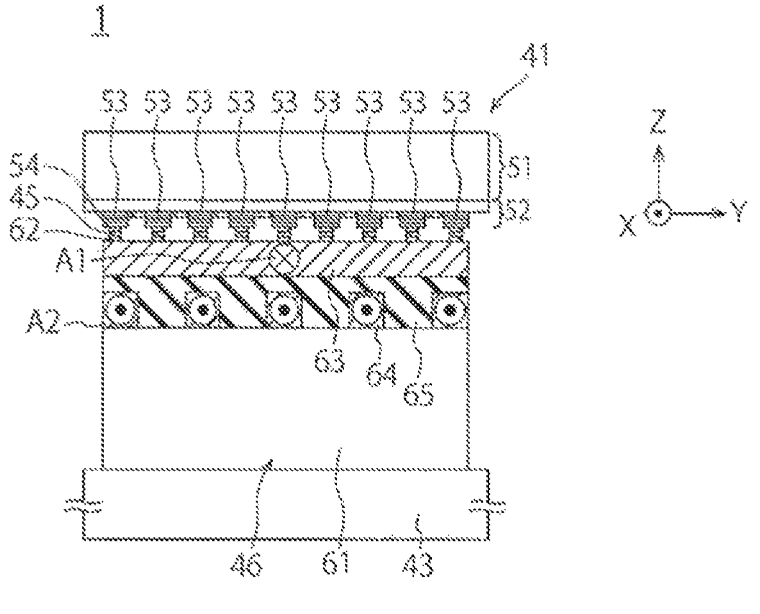
Figure 4:
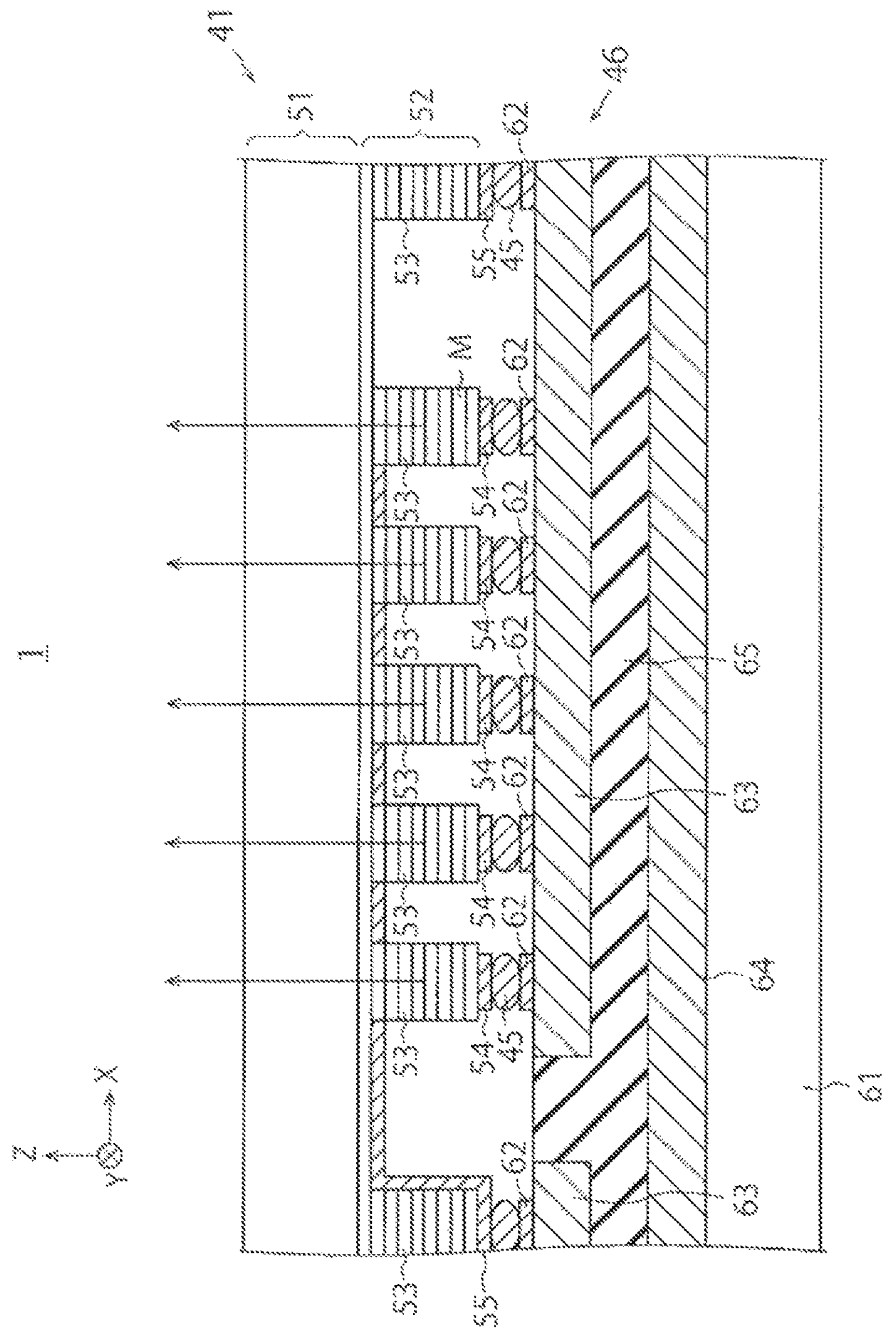
FIG. 4 is another cross-sectional view illustrating the structure of the light emitting device 1 of the first embodiment.

FIG. 3 is a cross-sectional view illustrating the structure of the light emitting device 1 of the first embodiment. A of FIG. 3 illustrates an X-Z cross section of the light emitting device 1, and B of FIG. 3 illustrates a Y-Z cross section of the light emitting device 1. FIG. 4 is another cross-sectional view illustrating the structure of the light emitting device 1 of the first embodiment, and specifically illustrates an enlarged X-Y cross section in A of FIG. 3. The light emitting device 1 is an example of the semiconductor device according to the present disclosure.

Hereinafter, the structure of the light emitting device 1 of the present embodiment will be described with reference to A of FIG. 3. In this description, B of FIG. 3 and FIG. 4 will also be referred to as appropriate.

As illustrated in A of FIG. 3, the LD chip 41 includes a substrate 51, a laminated film 52, a plurality of light emitting elements 53, a plurality of anode electrodes 54, and a plurality of cathode electrodes 55. The circuit board 46 includes a substrate 61, a plurality of connection pads 62, a plurality of signal wirings 63, a ground (GND) wiring 64, and an insulation film 65. The insulating substrate 47 includes a ceramic substrate 71, a wiring 72, a wiring 73, a wiring 74, and a wiring 75. The substrate 61 and the substrate 51 are examples of a first substrate and second substrate according to the present disclosure, respectively. The GND wiring 64 and the signal wirings 63 are examples of a lower wiring and upper wirings according to the present disclosure, respectively. The light emitting elements 53 are an example of elements according to the present disclosure.

The substrate 51 is, for example, a semiconductor substrate such as a gallium arsenide (GaAs) substrate. In A of FIG. 3, a front surface of the substrate 51 faces the −Z direction and is a lower surface of the substrate 51, and a back surface of the substrate 51 faces the +Z direction and is an upper surface of the substrate 51.

The laminated film 52 includes a plurality of layers laminated on the front surface (lower surface) of the substrate 51. Examples of these layers include an n-type semiconductor layer, an active layer, a p-type semiconductor layer, a light reflection layer, an insulation layer provided with a light exit window, and the like. The laminated film 52 includes a plurality of mesa parts M protruding in the −Z direction. Some of these mesa parts M are the plurality of light emitting elements 53.

The light emitting elements 53 are provided on a front surface of a substrate 52 as a part of the laminated film 52. The light emitting elements 53 of the present embodiment have a VCSEL structure and emit light in the +Z direction. As illustrated in FIG. 4, the light emitted from the light emitting elements 53 passes through the substrate 51 from the front surface to back surface (upper surface) of the substrate 51, and is emitted from the substrate 51. Thus, the LD chip 41 of the present embodiment is a back-side emission type VCSEL chip. A of FIG. 3 illustrates a plurality of light emitting elements 53 included in a light emitting element group D1, a plurality of light emitting elements 53 included in a light emitting element group D2, and a plurality of light emitting elements 53 included in a light emitting element group D3. Details of these light emitting element groups D1 to D3 will be described later.

The anode electrodes 54 are formed on lower surfaces of the light emitting elements 53. The cathode electrodes 55 are formed on lower surfaces of the mesa parts M other than the light emitting elements 53, and extends from the lower surfaces of the mesa parts M to a lower surface of the laminated film 52 between the mesa parts M. Each of the light emitting elements 53 emits light when current flows between a corresponding anode electrode 54 and a corresponding cathode electrode 55.

The substrate 61 is, for example, a semiconductor substrate such as a silicon (Si) substrate. In A of FIG. 3, a front surface of the substrate 61 faces the +Z direction and is the upper surface of the substrate 51, and a back surface of the substrate 61 faces the −Z direction and is the lower surface of the substrate 51. According to the present embodiment, it is possible to provide a circuit on an inexpensive Si substrate (substrate 51) with the light emitting elements 53 provided on a high-performance GaAs substrate (substrate 61).

The GND wiring 64, the insulation film 65, the signal wirings 63, and the connection pads 62 are formed in this order on the substrate 61. The GND wiring 64 is formed on the substrate 61 and is used to supply GND voltage. The signal wirings 63 are formed on the GND wiring 64 via the insulation film 65, and are used to supply signal voltage. The GND wiring 64 and the signal wirings 63 are electrically insulated from each other by the insulation film 65. The GND wiring 64 and the signal wirings 63 are, for example, Au (gold) wiring. The insulation film 65 is, for example, a silicon oxide film. The connection pads 62 are formed on the signal wirings 63 and are electrically connected to the signal wirings 63.

A of FIG. 3 illustrates an X-Z cross section of the four signal wirings 63, and B of FIG. 3 illustrates a Y-Z cross section of one signal wiring 63 of these signal wirings 63. As illustrated in A of FIG. 3, these signal wirings 63 are adjacent to each other in the X direction. Arrows in the signal wirings 63 in A of FIG. 3 and a reference sign A1 in B of FIG. 3 indicate a direction of current flowing in the signal wirings 63. The signal wirings 63 of the present embodiment are used such that the current flows in a −X direction. Note that details of a shape of the signal wirings 63 will be described later (refer to B of FIG. 7).

Furthermore, A of FIG. 3 illustrates an X-Z cross section of one GND wiring 64, and B of FIG. 3 illustrates a Y-Z cross sections of five parts of the signal wiring 64. As illustrated in B of FIG. 3, these parts are adjacent to each other in the Y direction. Arrows in the GND wiring 64 in A of FIG. 3 and a reference sign A2 in B of FIG. 3 indicate a direction of current flowing in the GND wiring 64. The GND wiring 64 of the present embodiment is used such that the current flows in a +X direction. Note that details of a shape of the GND wiring 64 will be described later (refer to C of FIG. 7).

In the present embodiment, the direction of the current flowing through the signal wirings 63 and the direction of the current flowing through the GND wiring 64 are opposite to each other. Hence, it is possible to cause a magnetic field generated around the signal wirings 63 and a magnetic field generated around the GND wiring 64 to cancel each other out.

As described above, the LD chip 41 of the present embodiment is mounted on the circuit board 46 via the bump 45. Specifically, the signal wirings 63 are formed on the substrate 61, the connection pads 62 are formed on the signal wirings 63, and further, the mesa parts M are disposed on the connection pads 62 via the bump 45, and the substrate 51 is disposed on the mesa parts M. Each of the mesa parts M is disposed on the bump 45 via an anode electrode 54 or a cathode electrode 55. Therefore, the light emitting elements 53 are electrically connected to the signal wirings 63 via the anode electrodes 54, the bump 45, and the connection pads 62 (refer to FIG. 4).

Meanwhile, the insulating substrate 47 includes wirings 72 to 75 on the ceramic substrate 71. The LDD board 42 is disposed on the wirings 72, 73, and is electrically connected to the signal wirings 63 via the wiring 72 and the bonding wires 49, and to the GND wiring 64 via the wiring 73 and the bonding wires 49. The capacitor 48 is disposed on the wirings 74, 75, and is electrically connected to the signal wirings 63 via the wiring 74 and the bonding wires 49, and to the GND wiring 64 via the wiring 75 and the bonding wires 49.

As described above, the LDD board 42 of the present embodiment includes the drive circuit 12 that drives the light emission unit 11. The drive circuit 12 in the LDD board 42 can drive the light emitting elements 53 in the LD chip 41 via the signal wirings 63 or the like.

Next, with reference to A of FIG. 3, further details of the light emitting elements 53, the signal wirings 63, and the GND wiring 64 will be described. In this description, B of FIG. 3 and FIG. 4 will also be referred to as appropriate.

A of FIG. 3 illustrates a plurality of light emitting elements 53 included in a light emitting element group D1, a plurality of light emitting elements 53 included in a light emitting element group D2, and a plurality of light emitting elements 53 included in a light emitting element group D3. In each of the light emitting element groups D1 to D3, as can be seen from A and B of FIG. 3, these light emitting elements 53 are disposed in a two-dimensional array.

The light emitting elements 53 of the light emitting element group D1 are provided on one same signal wiring 63, and the signal wiring 63 and another signal wiring 63 on the left thereof are connected in parallel to each other. These signal wirings 63 are an example of first and second wirings adjacent to each other according to the present disclosure. A similar applies to the light emitting element groups D2, D3. The light emitting elements 53 of the light emitting element group D2 are provided on one same signal wiring 63, and the signal wiring 63 and another signal wiring 63 on the left thereof are connected in parallel to each other. The light emitting elements 53 of the light emitting element group D3 are provided on one same signal wiring 63, and the signal wiring 63 and another signal wiring 63 on the left thereof are connected in parallel to each other.

Meanwhile, the light emitting elements 53 of the light emitting element group D1 and the light emitting elements 53 of the light emitting element group D2 are connected in series to each other by the signal wiring 63 below the light emitting element group D2. Similarly, the light emitting elements 53 of the light emitting element group D2 and the light emitting elements 53 of the light emitting element group D3 are connected in series to each other by the signal wiring 63 below the light emitting element group D3.

Thus, in the light emitting device 1 of the present embodiment, the light emitting elements 53 of the same light emitting element group, that is, the light emitting elements 53 on the same signal wiring 63 are connected in parallel to each other. Meanwhile, the light emitting elements 53 of different light emitting element groups, that is, the light emitting elements 53 on different signal wirings 63 are connected in series to each other.

A of FIG. 3 illustrates a parasitic capacitance C1 generated between the signal wiring 63 under the light emitting element group D1 and the GND wiring 64, a parasitic capacitance C2 generated between the signal wiring 63 under the light emitting element group D2 and the GND wiring 64, and a parasitic capacitance C3 generated between the signal wiring 63 under the light emitting element group D3 and the GND wiring 64. As will be described later, according to the present embodiment, it is possible to easily reduce parasitic capacitance between these signal wirings 63 and the GND wiring 64. Details of the parasitic capacitances C1 to C3 will be described later.

Figure 5:
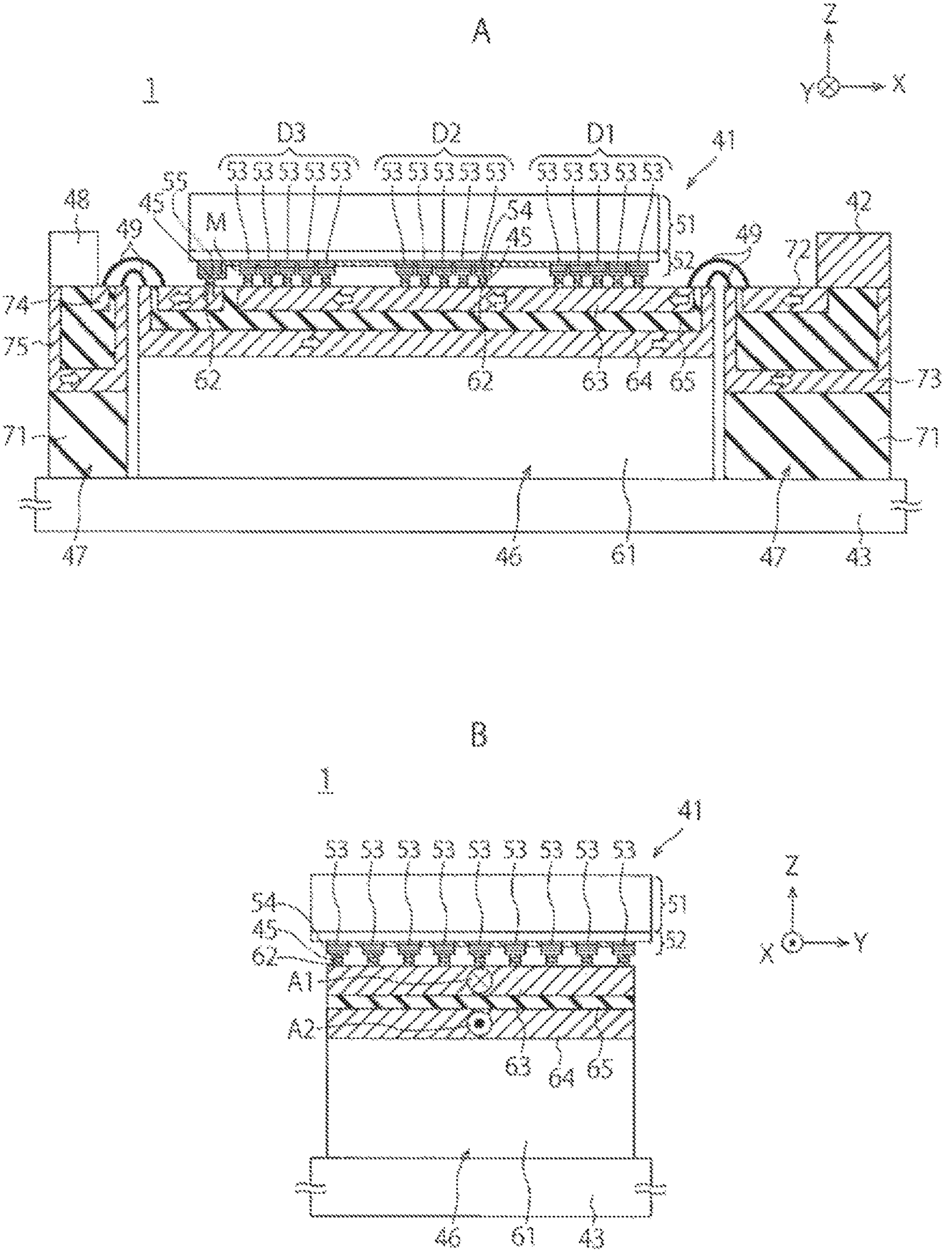
FIG. 5 is a cross-sectional view illustrating a structure of a light emitting device 1 of a first comparative example.

FIG. 5 is a cross-sectional view illustrating a structure of a light emitting device 1 of a first comparative example. A of FIG. 5 illustrates an X-Z cross section of the light emitting device 1, and B of FIG. 5 illustrates a Y-Z cross section of the light emitting device 1.

The light emitting device 1 of the present comparative example includes components identical to the components of the light emitting device 1 of the present embodiment. However, a circuit board 46 of the present comparative example includes only one signal wiring 63, and all mesa parts M of an LD chip 41 of the present comparative example are disposed on the signal wiring 63. Therefore, in the light emitting device 1 of the present comparative example, all light emitting elements 53 of the LD chip 41 are connected in parallel to each other. For example, the light emitting elements 53 of a light emitting element group D1, the light emitting elements 53 of a light emitting element group D2, and the light emitting elements 53 of a light emitting element group D3 are connected in parallel to each other by the signal wiring 63.

Figure 6:
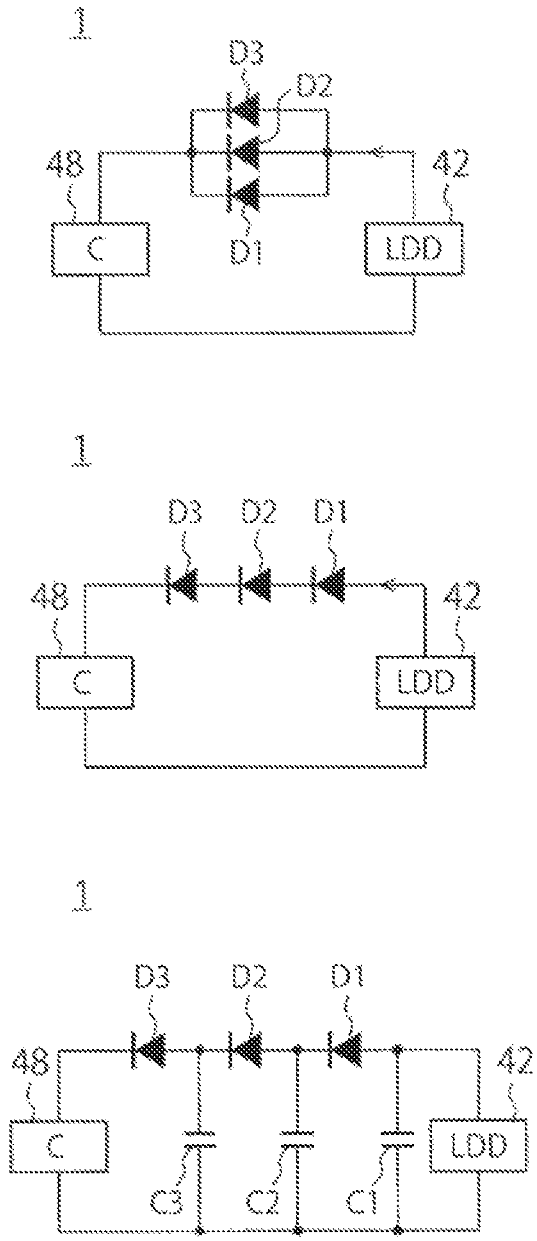
FIG. 6 is a circuit diagram for describing a difference between the first embodiment and the first comparative example.

FIG. 6 is a circuit diagram for describing a difference between the first embodiment and the first comparative example.

A of FIG. 6 illustrates a circuit configuration of the light emitting device 1 of the first comparative example. In the present comparative example, the light emitting element groups (diodes) D1 to D3 of the LD chip 41 are connected in parallel to each other between an LDD board 42 and a capacitor 48.

B of FIG. 6 illustrates a circuit configuration of the light emitting device 1 of the first embodiment. In the present embodiment, the light emitting element groups D1 to D3 of the LD chip 41 are connected in series to each other between the LDD board 42 and the capacitor 48. According to the present embodiment, by connecting the light emitting element groups D1 to D3 in series to each other, it is possible to reduce power consumption of the LDD board 42 as compared with a case where the light emitting element groups D1 to D3 are connected in parallel to each other.

C of FIG. 6 also illustrates a circuit configuration of the light emitting device 1 of the first embodiment. As described above, in the light emitting device 1 of the present embodiment, parasitic capacitances C1 to C3 as illustrated in C of FIG. 6 are generated. These parasitic capacitances C1 to C3 delay the signal voltage supplied by the signal wirings 63. Hence, for example, there is a possibility that a problem, such as a decrease in accuracy of distance measurement by the distance measurement device, occurs. Therefore, it is desirable to reduce the parasitic capacitances C1 to C3.

Figure 7:
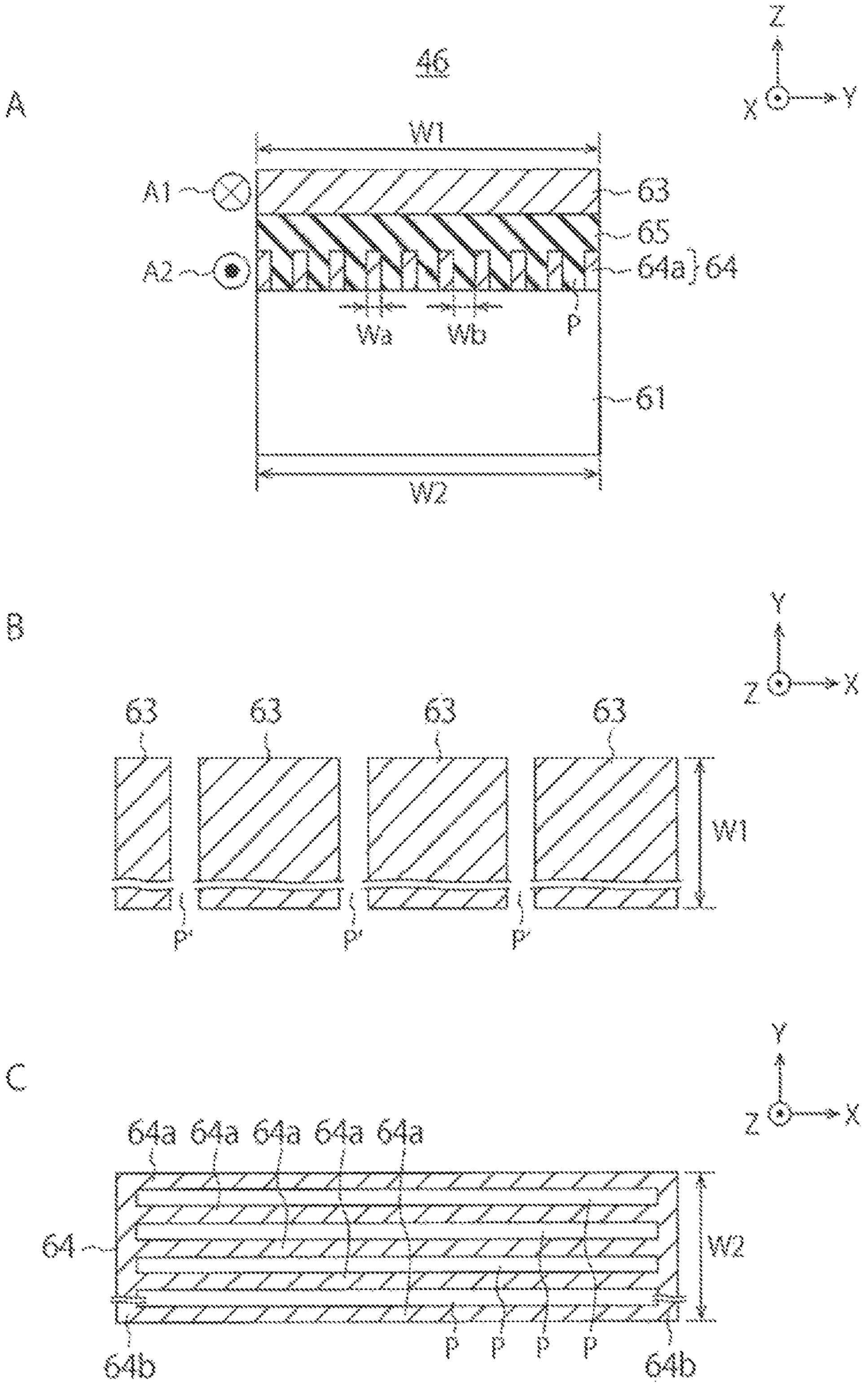
FIG. 7 is a cross-sectional view and plan view illustrating a structure of a circuit board 46 of the first embodiment.

FIG. 7 is a cross-sectional view and plan view illustrating a structure of the circuit board 46 of the first embodiment. Similarly to B of FIG. 3, A of FIG. 7 illustrates a Y-Z cross section of the circuit board 46. B of FIG. 7 illustrates a planar shape of the signal wirings 63. C of FIG. 7 illustrates a planar shape of the GND wiring 64.

As illustrated in B of FIG. 7, the circuit board 46 of the present embodiment includes the plurality of signal wirings 63 adjacent to each other in the X direction. B of FIG. 7 illustrates a width W1 of each of the signal wirings 63 in the Y direction and a plurality of openings P' provided so as to be sandwiched between the signal wirings 63 in the X direction. These openings P' have a linear shape extending in the Y direction, are adjacent to each other in the X direction, and are grooves (slits) sandwiched between the signal wirings 63.

The circuit board 46 of the present embodiment further includes one GND wiring 64 as illustrated in C of FIG. 7. C of FIG. 7 illustrates a width W2 of the GND wiring 64 in the Y direction and a plurality of openings P provided in the GND wiring 64. These openings P have a linear shape extending in the X direction, adjacent to each other in the Y direction, and are holes (holes) penetrating in the GND wiring 64. These openings P are an example of a first opening according to the present disclosure.

As illustrated in C of FIG. 7, the GND wiring 64 of the present embodiment includes three or more first parts 64*a* extending in the X direction and two second parts 64*b* extending in the Y direction. Each of the openings P is provided between the first parts 64*a* adjacent to each other in the Y direction. Furthermore, one second part 64*b* is provided at ends of these first parts 64*a* in the +X direction, and another second part 64*b* is provided at ends of these first parts 64*a* in the −X direction.

According to the present embodiment, it is possible to easily reduce the parasitic capacitances C1 to C3 by forming the openings P in the GND wiring 64. The parasitic capacitances C1 to C3 can be reduced, for example, by forming a cavity in the insulation film 65. However, it is difficult to perform a process of forming a cavity in the insulation film 65. Meanwhile, because a process of forming openings P in the GND wiring 64 can be performed with, for example, general photolithography and etching, the openings P can be easily formed. Therefore, according to the present embodiment, it is possible to easily reduce the parasitic capacitances C1 to C3 by forming the openings P in the GND wiring 64.

Because the openings P of the present embodiment are formed to extend in the X direction, the GND wiring 64 of the present embodiment includes the first parts 64*a* extending in the X direction. Therefore, according to the present embodiment, current can flow in the +X direction in the GND wiring 64 even if the openings P are formed in the GND wiring 64. Thus, it is desirable that the openings P have a shape extending in the X direction, but may not have a shape extending in the X direction as will be described later.

A of FIG. 7 illustrates a width W1 of each of the signal wirings 63 in the Y direction and a width W2 of the GND wiring 64 in the Y direction, similarly to B and C of FIG. 7. A of FIG. 7 further illustrates a width Wa of each of the first parts 64*a* in the Y direction and a width Wb of each of the openings P in the Y direction.

In the present embodiment, the width W1 of each of the signal wirings 63 is the same as the width W2 of the GND wiring 64 (W1=W2). Hence, it is possible to cause a magnetic field generated around the signal wirings 63 and a magnetic field generated around the GND wiring 64 to suitably cancel each other out. For example, it is possible to cause these magnetic fields to cancel each other out so that these combined magnetic fields become closer to zero.

However, such an effect can be obtained even if there is some difference between the width W1 and the width W2. For example, it is desirable that the width W1 of each of the signal wirings is 90% to 110% of the width W2 of the GND wiring ($W2\times0.9\leq W1\leq W2\times1.1$). Hence, it is possible to obtain substantially the same effect as a case where the width W1 and the width W2 are the same. Note that, in a case where the width W1 and the width W2 are different, it is more desirable to have the width W1 broader than the width W2 (W1>W2), than to have the width W1 narrower than the width W2 (W1<W2).

The width Wa of each of the first parts 64*a* and the width Wb of each of the openings P may be set to arbitrary values. In the present embodiment, the widths Wa of all the first parts 64*a* of the GND wiring 64 are set to the same value, and the widths Wb of all the openings P in the GND wiring 64 are set to the same value.

Figure 8:
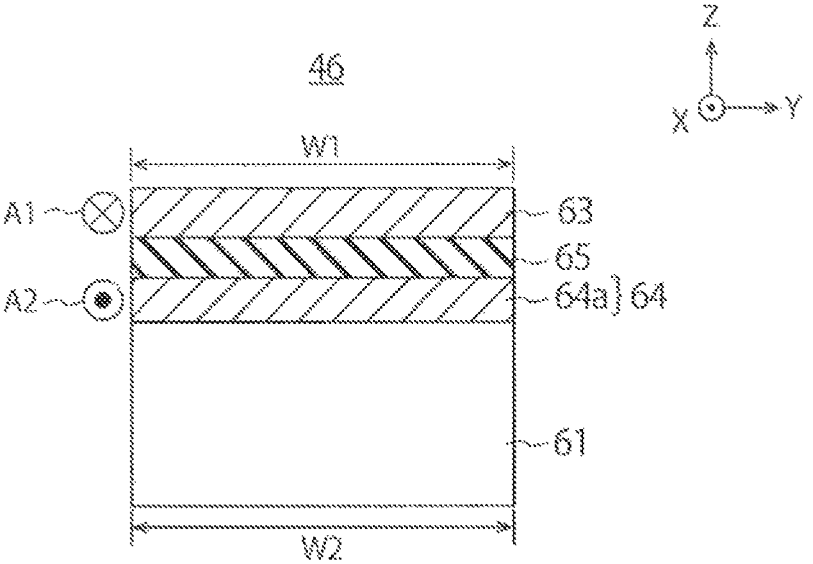
FIG. 8 is a cross-sectional view and plan view illustrating a structure of a circuit board 46 of a second comparative example.
Figure 8:
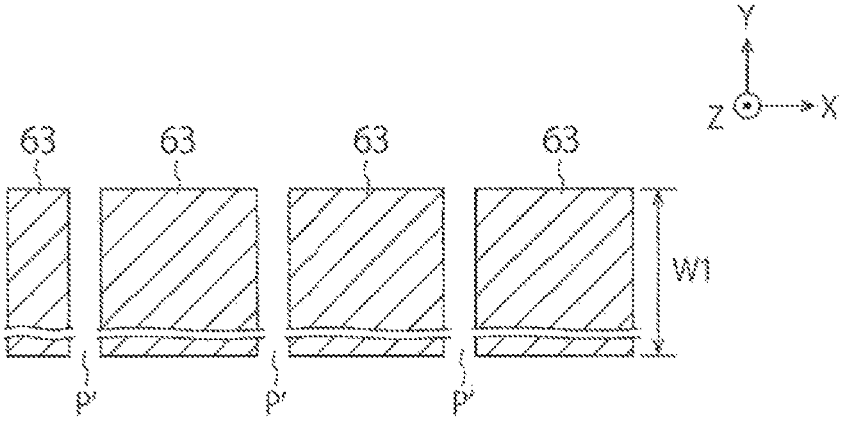
Figure 8:
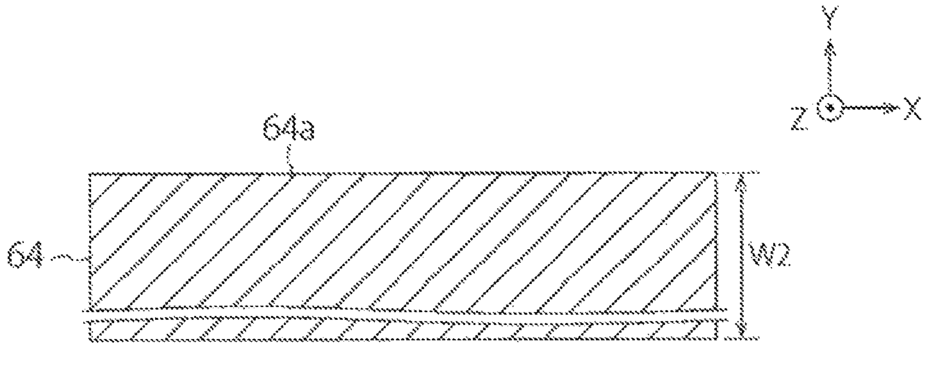
Figure 9:
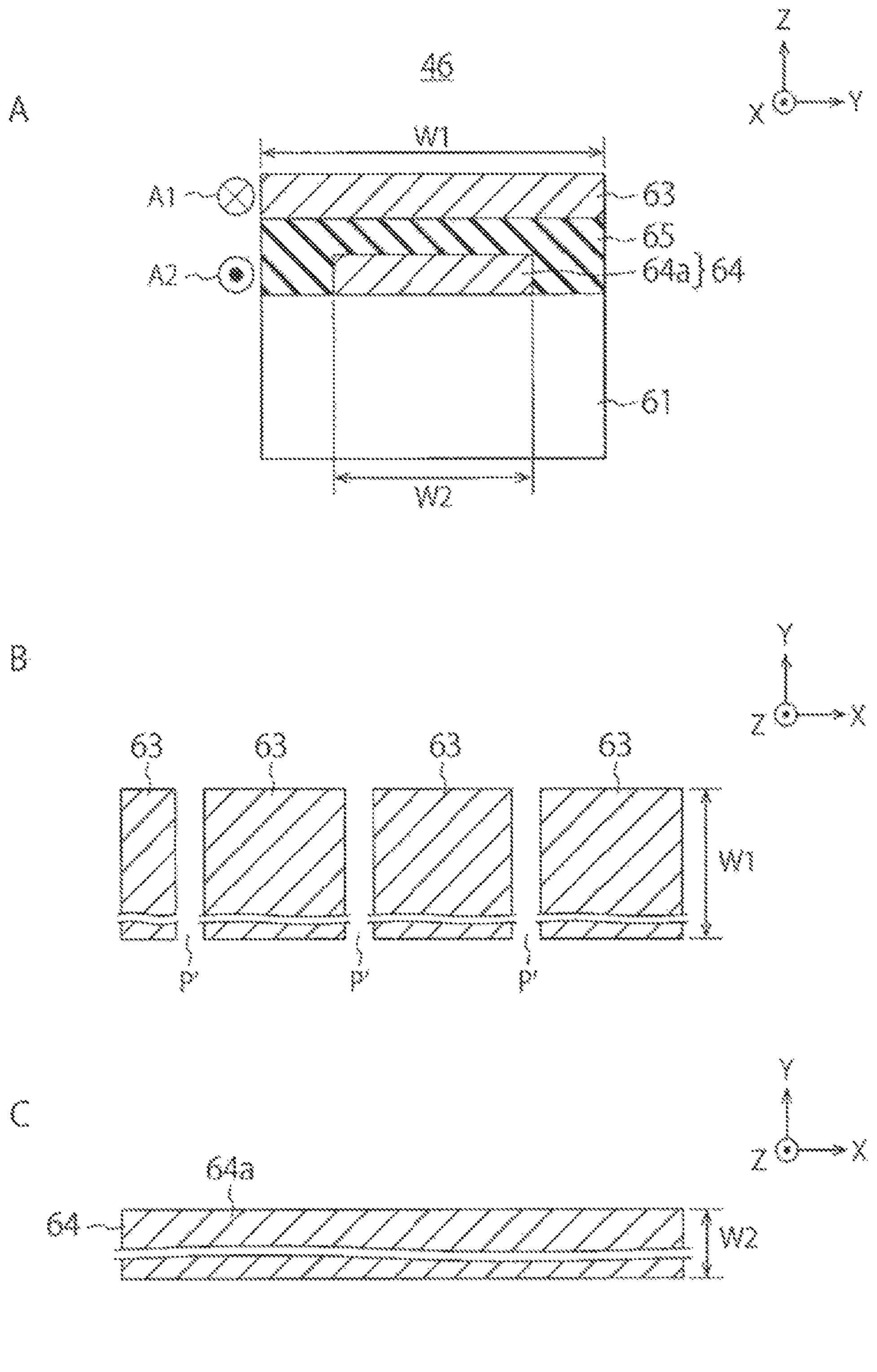
FIG. 9 is a cross-sectional view and plan view illustrating a structure of a circuit board 46 of a third comparative example.
Figure 10:
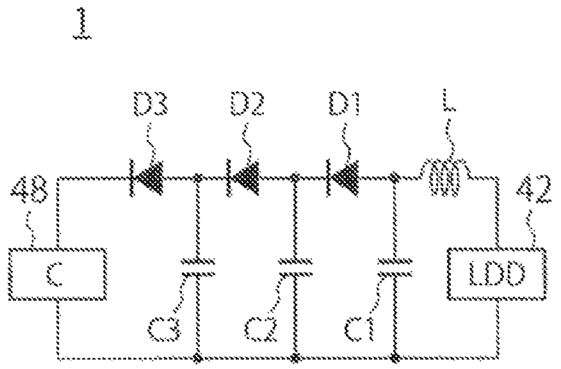
FIG. 10 is a circuit diagram for describing a problem in the third comparative example.

Next, the first embodiment is compared with second and third comparative examples with reference to FIGS. 8 to 10.

FIG. 8 is a cross-sectional view and plan view illustrating a structure of a circuit board 46 of the second comparative example. A to C of FIG. 8 correspond to A to C in FIG. 7, respectively.

Signal wirings 63 of the present comparative example has a shape identical to the shape of the signal wirings 63 of the first embodiment. Meanwhile, while the GND wiring 64 of the first embodiment has the openings P, a GND wiring 64 of the present comparative example has no opening P. Therefore, in the present comparative example, a large parasitic capacitance is generated between the signal wirings 63 and the GND wiring 64.

In general, a capacitance C between two electrodes is given by $C=\varepsilon S/d$. Here, d represents a distance between the electrodes, S represents an area of each electrode, and ε represents permittivity of a material between the electrodes. Therefore, parasitic capacitance between the signal wirings 63 and the GND wiring 64 can be reduced, for example, by reducing an area of the signal wirings 63 or an area of the GND wiring 64.

FIG. 9 is a cross-sectional view and plan view illustrating a structure of a circuit board 46 of the third comparative example. A to C of FIG. 9 correspond to A to C in FIG. 7, respectively.

Signal wirings 63 and GND wiring 64 of the present comparative example have shapes substantially identical to shapes of the signal wirings 63 and GND wiring 64 of the second comparative example, respectively. However, in the present comparative example, a width W2 of the GND wiring 64 is narrower than a width W1 of the signal wirings 63. Hence, parasitic capacitances in the present comparative example are smaller than the parasitic capacitances in the second comparative example. This is because an area of the GND wiring 64 decreases as the width W2 of the GND wiring 64 decreases.

FIG. 10 is a circuit diagram for describing a problem in the third comparative example.

Similarly to C of FIG. 6, FIG. 10 illustrates a circuit configuration of the light emitting device 1 of the present comparative example. In the present comparative example, light emitting element groups D1 to D3 of an LD chip 41 are connected in parallel to each other between an LDD board 42 and a capacitor 48.

As described above, according to the present comparative example, parasitic capacitances C1 to C3 can be reduced as compared with a case of the second comparative example. However, if the width W2 of the GND wiring 64 is reduced as in the present comparative example, a large parasitic inductance L is generated between the LDD board 42 and the light emitting element groups D1 to D3. This is because a magnetic field generated around the signal wirings 63 and a magnetic field generated around the GND wiring 64 cancel each other out less. Such a parasitic inductance L may interfere with operation of a drive circuit 12 (FIG. 1).

Therefore, in the present embodiment, the openings P are provided in the GND wiring 64 while the width W2 of the GND wiring 64 is set to be the same as the width W1 of the signal wirings 63. Hence, it is possible to reduce the parasitic capacitances C1 to C3 while reducing an increase in the parasitic inductance L. Similarly to the case of the second comparative example, the parasitic capacitances C1 to C3 of the present embodiment are reduced by the area of the GND wiring 64 decreasing. Meanwhile, similarly to the first comparative example, the parasitic inductance L of the present embodiment is reduced by setting the width W2 the same as the width W1. Hence, it is possible to achieve both a reduction in the parasitic capacitances C1 to C3 and a reduction in the parasitic inductance L.

As described above, the circuit board 46 of the present embodiment includes the openings P provided in the GND wiring 64. Therefore, according to the present embodiment, it is possible to easily reduce the parasitic capacitances C1 to C3 between the signal wirings 63 and the GND wiring 64.

Hereinafter, circuit boards 46 and GND wirings 64 of second to eighth embodiments will be described. The second to eighth embodiments are modifications of the first embodiment, and the second to eighth embodiments will be described focusing on differences from the first embodiment. Similarly to the circuit board 46 and GND wiring 64 of the first embodiment, a circuit board 46 and GND wiring 64 of any one of the second to eighth embodiments are provided in a light emitting device 1 as illustrated in A of FIG. 3 and the like.

Second Embodiment

Figure 11:
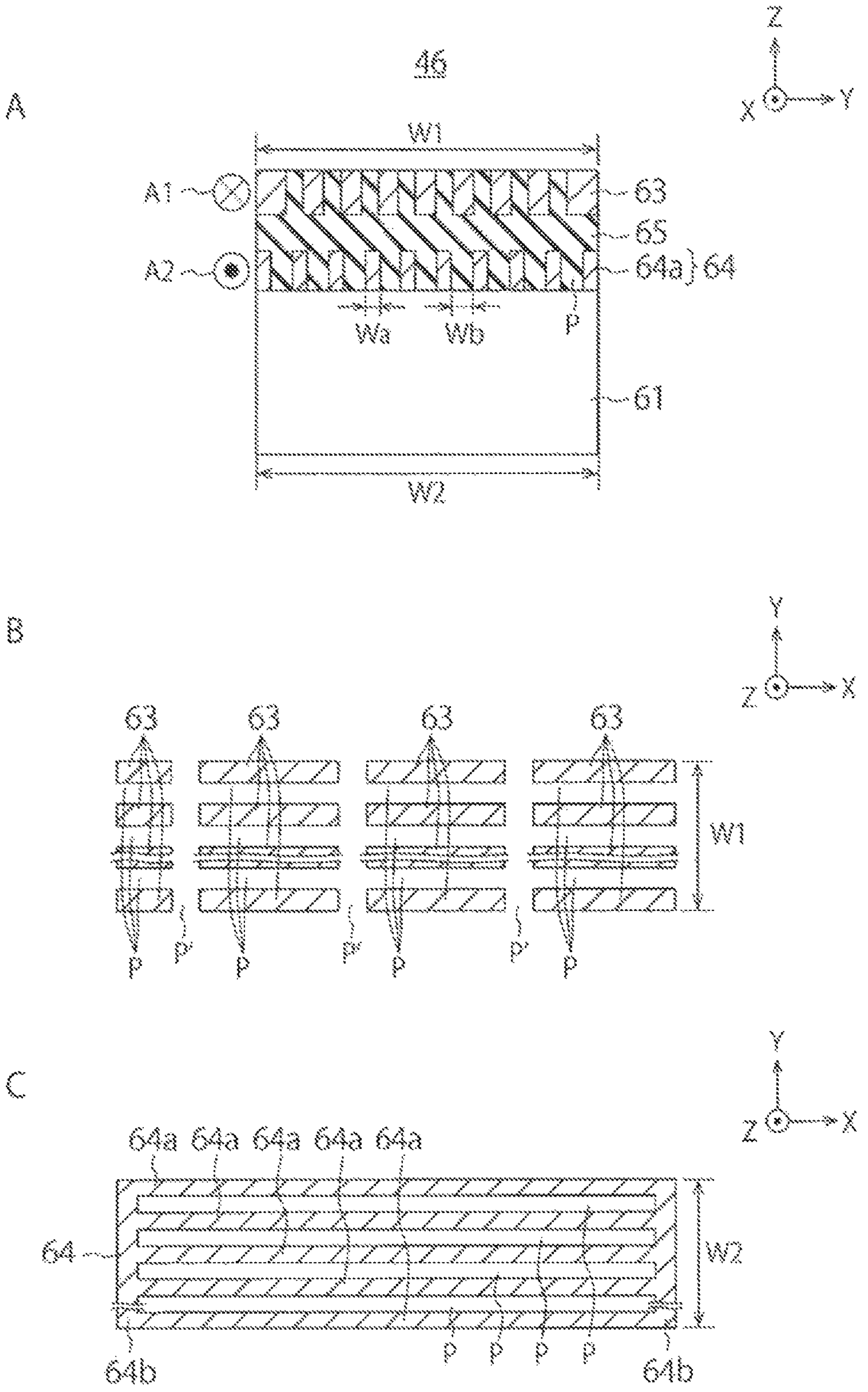
FIG. 11 is a cross-sectional view and plan view illustrating a structure of a circuit board 46 of a second embodiment.

FIG. 11 is a cross-sectional view and plan view illustrating a structure of the circuit board 46 of the second embodiment. A to C of FIG. 11 correspond to A to C of FIG. 7, respectively.

The circuit board 46 of the present embodiment includes a plurality of signal wirings 63 having a shape different from a shape of the signal wirings 63 of the first embodiment, and one GND wiring 64 having a shape identical to a shape of the GND wiring 64 of the first embodiment. These signal wirings 63 are adjacent to each other in an X direction and a Y direction as illustrated in B of FIG. 11. The circuit board 46 of the present embodiment includes a plurality of openings P' provided so as to be sandwiched between the signal wirings 63 adjacent to each other in the X direction, and a plurality of openings P provided so as to be sandwiched between the signal wirings 63 adjacent to each other in the Y direction. The openings P' between the signal wirings 63 extend in the Y direction and are adjacent to each other in the X direction, whereas the openings P between the signal wirings 63 extend in the X direction and are adjacent to each other in the Y direction. The openings P between the signal wirings 63 are an example of a second opening according to the present disclosure.

According to the present embodiment, by forming the openings P between the signal wirings 63, it is possible to easily reduce parasitic capacitances C1 to C3, similarly to a case of forming the openings P in the GND wiring 64. Furthermore, according to the present embodiment, the openings P can be formed between the signal wirings 63 and can be formed in the GND wiring 64, and therefore, it is possible to increase a degree of freedom in designing the signal wirings 63 and the GND wiring 64.

Because the openings P of the present embodiment are formed to extend in the X direction, each of the signal wirings 63 of the present embodiment has a shape extending in the X direction, and the GND wiring 64 of the present embodiment includes the first parts 64*a* extending in the X direction. Therefore, according to the present embodiment, current can flow in the −X direction in the signal wirings 63 even if the openings P are formed between the signal wirings 63, and current can flow in the +X direction in the GND wiring 64 even if the openings P are formed in the GND wiring 64. Thus, it is desirable that the openings P have a shape extending in the X direction, but may not have a shape extending in the X direction as will be described later.

Furthermore, as illustrated in A of FIG. 11, the openings P in the GND wiring 64 of the present embodiment are provided at a position facing the signal wirings 63 in the Z direction, and the openings P between the signal wirings 63 of the present embodiment are provided at a position facing the GND wiring 64 in the Z direction. In other words, the openings P in the GND wiring 64 and the openings P between the signal wirings 63 are alternately arranged. Hence, it is possible to further reduce the parasitic capacitances C1 to C3.

Figure 12:
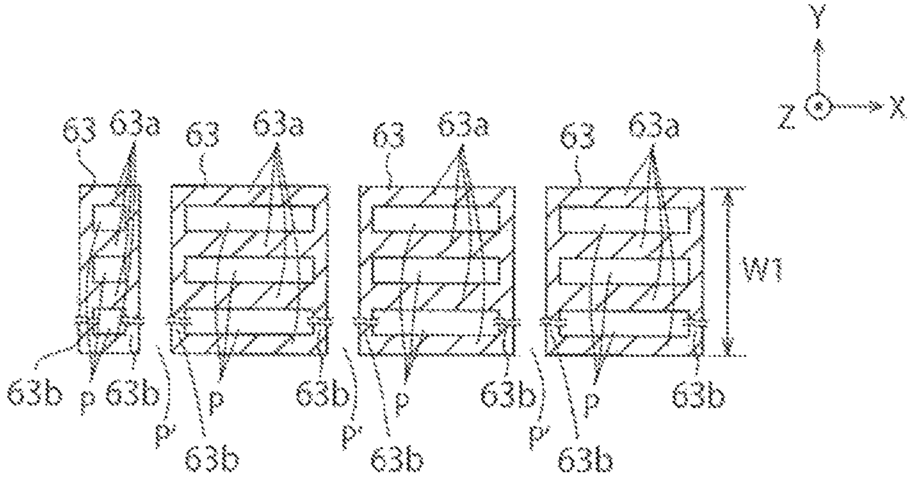
FIG. 12 is a plan view illustrating structures of signal wirings 63 and GND wiring 64 of a modification of the second embodiment.
Figure 12:
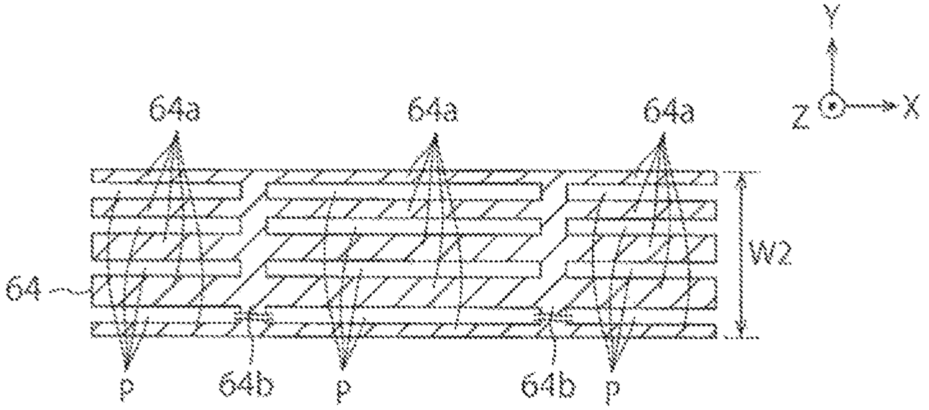

FIG. 12 is a plan view illustrating structures of the signal wirings 63 and GND wiring 64 of modifications of the second embodiment.

A of FIG. 12 illustrates the signal wirings 63 of a first modification of the present embodiment. In the signal wirings 63 of the present modification, the openings P are provided in the signal wirings 63. Specifically, each of the signal wirings 63 of the present modification includes three or more first parts 63*a* extending in the X direction and two second parts 63*b* extending in the Y direction, and each of the openings P is provided between the first parts 63*a* adjacent to each other in the Y direction. The openings P in the signal wirings 63 are an example of the second opening according to the present disclosure. The signal wirings 63 of the present modification may face the GND wiring 64 illustrated in C of FIG. 11, or may face the GND wiring 64 of a second modification described later.

B of FIG. 12 illustrates the GND wiring 64 of the second modification of the present embodiment. In the GND wiring 64 of the present modification, the openings P are provided in the GND wiring 64 or are provided so as to be sandwiched between the GND wirings 63 in the Y direction. Each of the former openings P is surrounded by two first parts 64*a* and two second parts 64*b*, and each of the latter openings P is adjacent to two first parts 64*a* and one second part 64*b*. The openings P between the GND wirings 64 are an example of the first opening according to the present disclosure. The GND wiring 64 of the present modification may face the signal wirings 63 illustrated in B of FIG. 11, or may face the signal wirings 63 of the first modification described above.

Note that each of the openings P between the signal wirings 63 illustrated in B of FIG. 11 is sandwiched between two signal wirings 63, and each of the openings P between the GND wirings 64 illustrated in B of FIG. 12 is sandwiched between two parts (first parts 64*a*) of one GND wiring 64. However, each of the openings P of the former may be sandwiched between two parts of one signal wiring 63, and each of the openings P of the latter may be sandwiched between two GND wirings 64.

As described above, a circuit board 46 of the present embodiment includes the openings P provided between the signal wirings 63 in addition to the openings P provided in the GND wiring 64. Therefore, according to the present embodiment, the parasitic capacitances C1 to C3 between the signal wirings 63 and the GND wiring 64 can be further reduced, and a degree of freedom in designing the signal wirings 63 and the GND wiring 64 can be increased.

Third Embodiment

Figure 13:
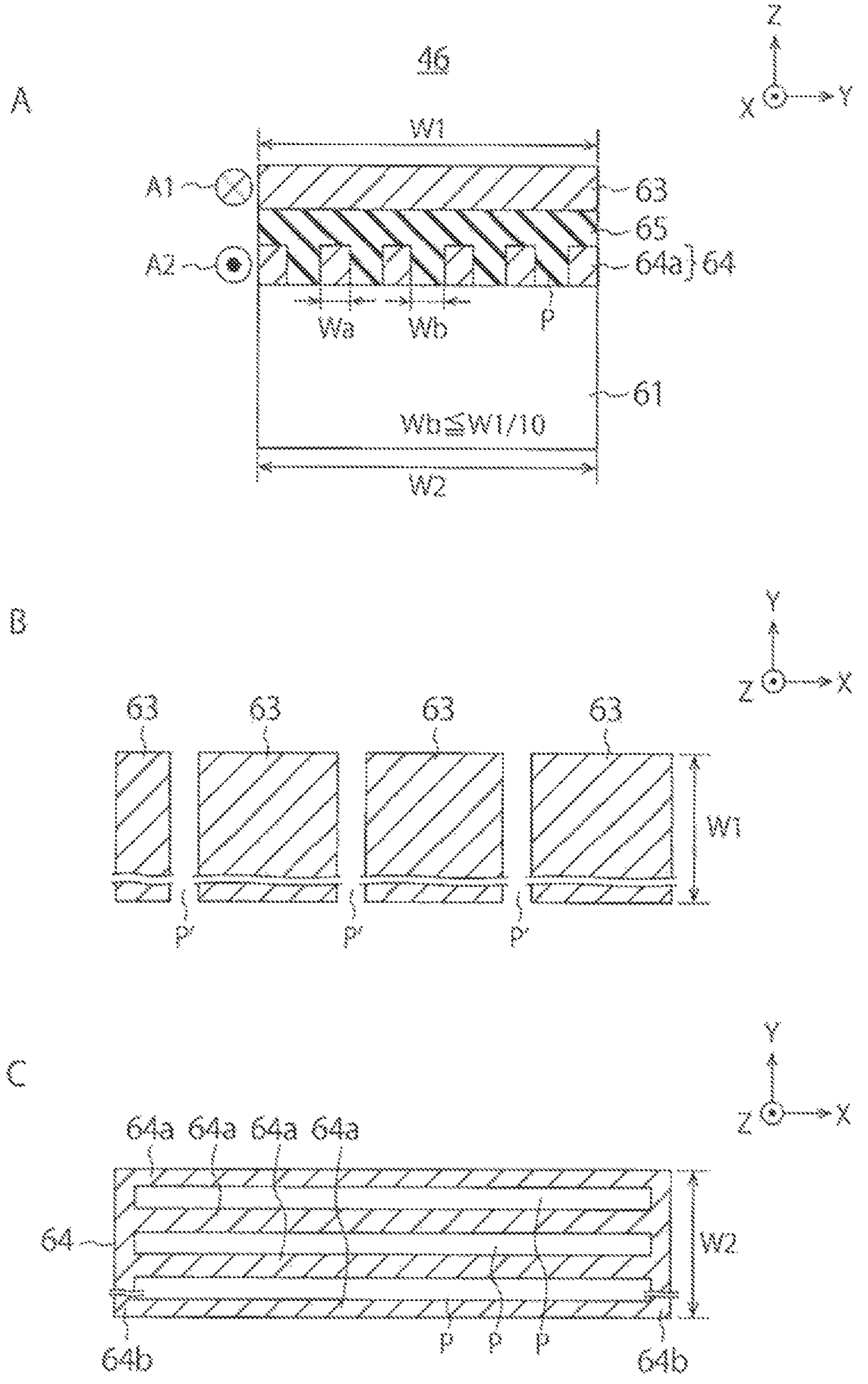
FIG. 13 is a cross-sectional view and plan view illustrating a structure of a circuit board 46 of a third embodiment.

FIG. 13 is a cross-sectional view and plan view illustrating a structure of the circuit board 46 of the third embodiment. A to C of FIG. 13 correspond to A to C in FIG. 7, respectively.

The circuit board 46 of the present embodiment includes a plurality of signal wirings 63 having a shape identical to the shape of the signal wirings 63 of the first embodiment, and one GND wiring 64 having a shape substantially identical to the shape of the GND wiring 64 of the first embodiment. However, in the present embodiment, a width Wb of the openings P in the GND wiring 64 is set to one tenth or less of a width W1 of the signal wirings 63 ($Wb \leq W1/10$).

As a result of a simulation, it has been found that parasitic capacitances C1 to C3 can be effectively reduced by forming openings P in the GND wiring 64 such that the width Wb is one tenth or less of the width W1. Therefore, the width Wb in the present embodiment is set to one tenth or less of the width W1. This condition may be applied to a case where the openings P are formed between the GND wirings 64, in the signal wirings 63, or between the signal wirings 63.

Note that the width W1 of the signal wirings 63 is the same as a width W2 of the GND wiring 64 in the present embodiment, but may be different from the width W2 of the GND wiring 64. For example, the width W1 may be 90% to 110% of the width W2, or may be wider than the width W2.

Fourth Embodiment

Figure 14:
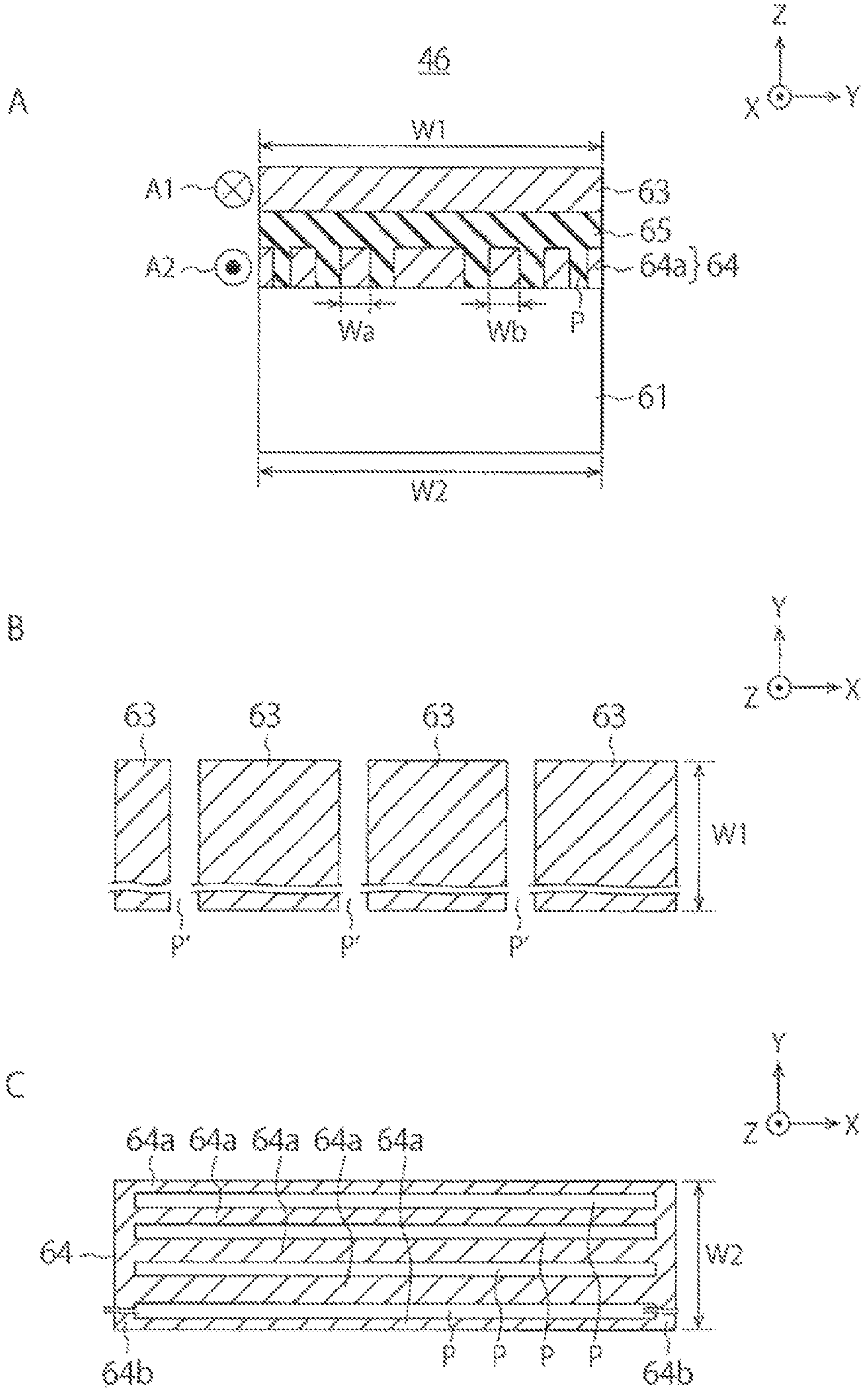
FIG. 14 is a cross-sectional view and plan view illustrating a structure of a circuit board 46 of a fourth embodiment.

FIG. 14 is a cross-sectional view and plan view illustrating a structure of the circuit board 46 of the fourth embodiment. A to C of FIG. 14 correspond to A to C in FIG. 7, respectively.

The circuit board 46 of the present embodiment includes a plurality of signal wirings 63 having a shape identical to the shape of the signal wirings 63 of the first embodiment, and one GND wiring 64 having a shape substantially identical to the shape of the GND wiring 64 of the first embodiment. However, the GND wiring 64 of the present embodiment includes first parts 64*a* having different widths Wa as the above-described first parts 64*a*. Thus, in the GND wiring 64 of the present embodiment, the widths Wa of all the first parts 64*a* may not have the same value. Hence, it is possible to increase a degree of freedom in designing the GND wiring 64 as compared with a case where the widths Wa of all the first parts 64*a* are the same.

Note that, similarly to the GND wiring 64 of the present embodiment, each of the signal wirings 63 of the second embodiment may also include the first parts 63*a* having different widths in the Y direction. Hence, it is possible to increase a degree of freedom in designing each of the signal wirings 63 as compared with a case where the widths of all the first parts 63*a* are the same.

Fifth Embodiment

Figure 15:
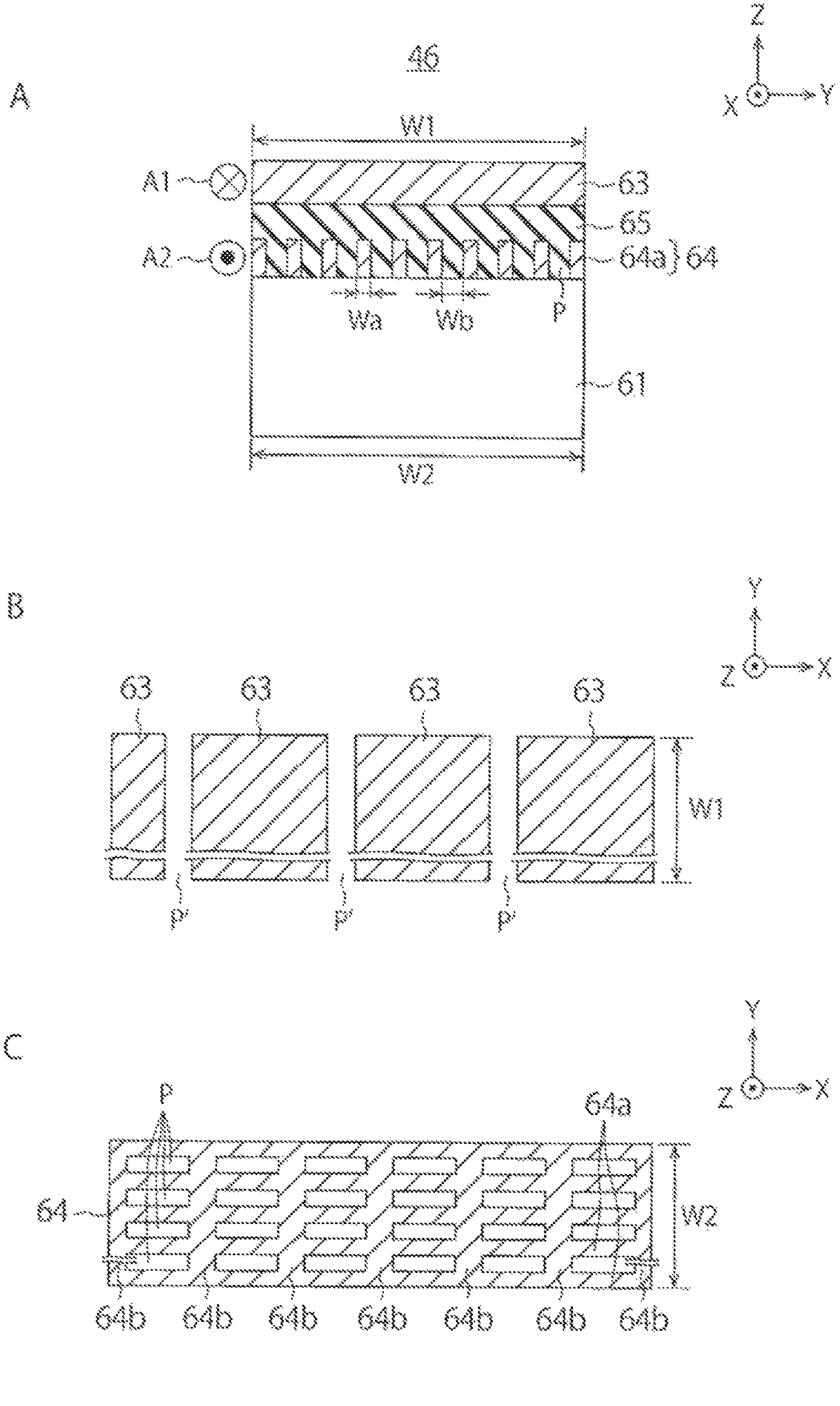
FIG. 15 is a cross-sectional view and plan view illustrating a structure of a circuit board 46 of a fifth embodiment.

FIG. 15 is a cross-sectional view and plan view illustrating a structure of the circuit board 46 of the fifth embodiment. A to C of FIG. 15 correspond to A to C in FIG. 7, respectively.

The circuit board 46 of the present embodiment includes a plurality of signal wirings 63 having a shape different from a shape of the signal wirings 63 of the first embodiment, and one GND wiring 64 having a shape identical to a shape of the GND wiring 64 of the first embodiment. Specifically, as illustrated in C of FIG. 15, the GND wiring 64 of the present embodiment includes three or more first parts 64*a* extending in an X direction and three or more second parts 64*b* extending in a Y direction, and includes a plurality of openings P disposed in a two-dimensional array. These openings P extend in the X direction and are adjacent to each other in the X direction and the Y direction. According to the present embodiment, it is possible to provide a large number of small openings P in the GND wiring 64.

Note that, similarly to the GND wiring 64 of the present embodiment, each of the signal wirings 63 of the second embodiment may also include a plurality of openings P disposed in a two-dimensional array. Hence, it is possible to provide a large number of small openings P in each of the signal wirings 63.

Sixth to Eighth Embodiments

Figure 16:
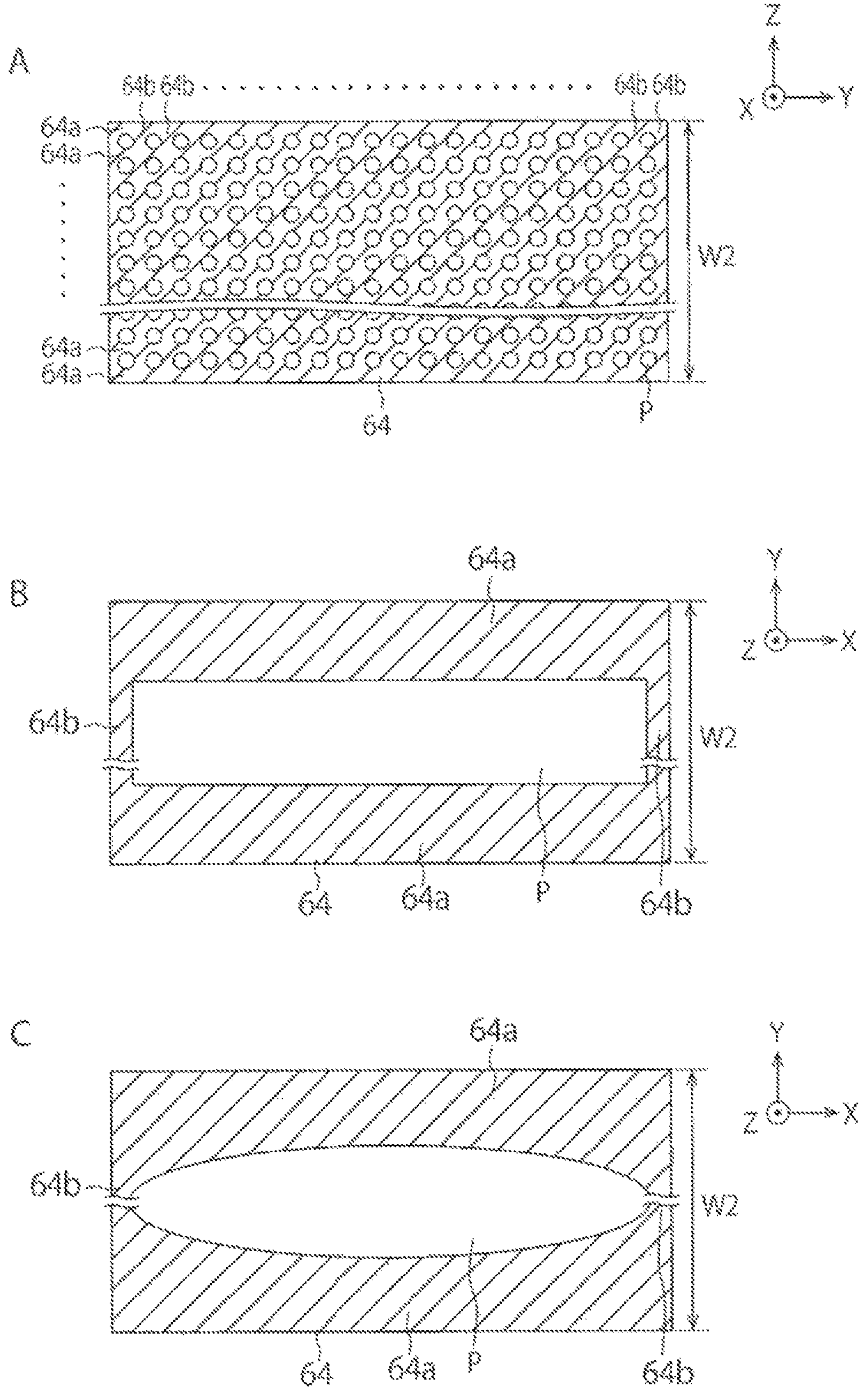
FIG. 16 is a plan view illustrating shapes of GND wirings 64 of sixth to eighth embodiments.

FIG. 16 is a plan view illustrating shapes of GND wirings 64 of sixth to eighth embodiments. The sixth to eighth embodiments correspond to modifications of the fifth embodiment.

A of FIG. 16 illustrates a shape of the GND wiring 64 of the sixth embodiment. Similarly to the GND wiring 64 of the fifth embodiment, the GND wiring 64 of the present embodiment includes a plurality of openings P disposed in a two-dimensional array. However, each of the openings P of the present embodiment has a circular planar shape. According to the present embodiment, it is possible to provide a large number of small openings P in the GND wiring 64.

B of FIG. 16 illustrates a shape of the GND wiring 64 of the seventh embodiment. The GND wiring 64 of the present embodiment includes only one opening P. The opening P extends in an X direction and has a rectangular planar shape. According to the present embodiment, it is possible to provide a large single opening P in the GND wiring 64.

C of FIG. 16 illustrates a shape of the GND wiring 64 of the eighth embodiment. The GND wiring 64 of the present embodiment also includes only one opening P. The opening P extends in an X direction and has an elliptical planar shape. According to the present embodiment, it is possible to provide a large single opening P in the GND wiring 64.

Note that the openings P of any one of the sixth to eighth embodiments may be applied to each of the signal wirings 63 of the second embodiment. Hence, it is possible to provide a large number of small openings P in each of the signal wirings 63 or to provide a large single opening P in each of the signal wirings 63.

Note that the light emitting devices 1 of the first to eighth embodiments are used as a light source of a distance measurement device, but may be used in another mode. For example, the light emitting devices 1 of these embodiments may be used as a light source of an optical apparatus such as a printer, or may be used as a lighting device.

Although the embodiments according to the present disclosure have been described above, these embodiments may be implemented with various modifications without departing from the gist of the present disclosure. For example, two or more embodiments may be implemented in combination.

Note that the present disclosure can also have the following configurations.

(1)

A semiconductor device including a first substrate, a lower wiring provided on the first substrate, a plurality of upper wirings provided on the lower wiring via an insulation film, and a second substrate provided on the upper wirings via a plurality of elements, in which the upper wirings include a first wiring and a second wiring adjacent to each other in a first direction, the elements on the first wiring and the elements on the second wiring are connected in series to each other, and a first opening is provided in the lower wiring or provided so as to be sandwiched between the lower wirings in a second direction different from the first direction, or a second opening is provided in the upper wirings or provided so as to be sandwiched between the upper wirings in the second direction.

(2)

The semiconductor device according to (1), in which the elements on the first wiring are connected in parallel to each other, and the elements on the second wiring are connected in parallel to each other.

(3)

The semiconductor device according to (1), in which the elements include light emitting elements provided on the second substrate.

(4)

The light emitting device according to (3), in which light emitted from the light emitting elements passes through the second substrate from a lower surface to upper surface of the second substrate, and is emitted from the second substrate.

(5)

The semiconductor device according to (1), in which the lower wiring is used such that current flows in the first direction, and the upper wirings are used such that current flows in a direction opposite to the first direction.

(6)

The semiconductor device according to (1), in which an opening extending in the first direction is provided as the first or second opening.

(7)

The semiconductor device according to (1), in which a plurality of openings extending in the first direction and adjacent to each other in the second direction is provided as the first or second openings.

(8)

The semiconductor device according to (7), in which the lower wiring or the upper wirings include a plurality of first parts extending in the first direction and a plurality of second parts extending in the second direction, and each of the plurality of openings is provided between the first parts adjacent to each other in the second direction.

(9)

The semiconductor device according to (1), in which a width of the upper wirings in the second direction is the same as a width of the lower wiring in the second direction.

(10)

The semiconductor device according to (1), in which a width of the upper wirings in the second direction is wider than a width of the lower wiring in the second direction.

(11)

The semiconductor device according to (1), in which a width of the upper wirings in the second direction is 90% to 110% of a width of the lower wiring in the second direction.

(12)

The semiconductor device according to (1), in which the first opening is provided in the lower wiring or provided so as to be sandwiched between the lower wirings in the second direction, and the second opening is provided in the upper wirings or provided so as to be sandwiched between the upper wirings in the second direction.

(13)

The semiconductor device according to (12), in which the first opening is provided at a position facing the upper wirings vertically, and the second opening is provided at a position facing the lower wiring vertically.

(14)

The semiconductor device according to (12), in which a plurality of openings extending in the first direction is provided as the first opening, the lower wiring includes a plurality of first parts extending in the first direction and a plurality of second parts extending in the second direction, and each of the plurality of openings is provided between the first parts adjacent to each other in the second direction.

(15)

The semiconductor device according to (12), in which a plurality of openings extending in the first direction is provided as the second openings, and each of the plurality of openings is provided between the upper wirings adjacent to each other in the second direction.

(16)

The semiconductor device according to (1), in which a width of the first or second opening in the second direction is one tenth or less of a width of the upper wirings in the second direction.

(17)

The semiconductor device according to (8), in which the plurality of first parts includes first parts having different widths in the second direction.

(18)

The semiconductor device according to (1), in which a plurality of openings disposed in a two-dimensional array is provided as the first or second opening.

(19)

The semiconductor device according to (1), in which, as the first or second opening, only one opening is provided in the upper wirings or in the lower wiring, or only one opening is provided so as to be sandwiched between the upper wirings in the second direction or between the lower wirings in the second direction.

(20)

The light emitting device according to (1), in which the first substrate includes a semiconductor substrate including silicon (Si), and the second substrate includes a semiconductor substrate including gallium (Ga) and arsenic (As).

REFERENCE SIGNS LIST

1 Light emitting device
2 Imaging device
3 Control device
11 Light emission unit
12 Drive circuit
13 Power supply circuit

14 Light-emitting side optical system
21 Image sensor
22 Image processing unit
23 Imaging-side optical system
31 Distance measurement unit
41 LD chip
42 LDD board
43 Mounting board
44 Wiring
45 Bump
46 Circuit board
47 Insulating substrate
48 Capacitor
49 Bonding wire
51 Substrate
52 Laminated film
53 Light emitting element
54 Anode electrode
55 Cathode electrode
61 Substrate
62 Connection pad
63 Signal wiring
63*a* First part
63*b* Second part
64 GND wiring
64*a* First part
64*b* Second part
65 Insulation film
71 Ceramic substrate
72 Wiring
73 Wiring
74 Wiring
75 Wiring

The invention claimed is:

1. A semiconductor device comprising:
a first substrate;
a lower wiring provided on the first substrate;
a plurality of upper wirings provided on the lower wiring via an insulation film; and
a second substrate provided on the upper wirings via a plurality of elements,
wherein the upper wirings include a first wiring and a second wiring adjacent to each other in a first direction,
the elements on the first wiring and the elements on the second wiring are connected in series to each other,
a first opening is provided in the lower wiring or provided so as to be sandwiched between parts of the lower wiring in a second direction different from the first direction, or a second opening is provided in the upper wirings or provided so as to be sandwiched between the upper wirings in the second direction, and
a plurality of openings extending in the first direction and adjacent to each other in the second direction is provided as the first or second openings.

2. The semiconductor device according to claim 1,
wherein the elements on the first wiring are connected in parallel to each other, and
the elements on the second wiring are connected in parallel to each other.

3. The semiconductor device according to claim 1, wherein the elements include light emitting elements provided on the second substrate.

4. The semiconductor device according to claim 3, wherein light emitted from the light emitting elements passes through the second substrate from a lower surface to upper surface of the second substrate, and is emitted from the second substrate.

5. The semiconductor device according to claim 1,
wherein the lower wiring is used such that current flows in the first direction, and
the upper wirings are used such that current flows in a direction opposite to the first direction.

6. The semiconductor device according to claim 1, wherein an opening extending in the first direction is provided as the first or second opening.

7. The semiconductor device according to claim 1,
wherein the lower wiring or the upper wirings include a plurality of first parts extending in the first direction and a plurality of second parts extending in the second direction, and
each of the plurality of openings is provided between the first parts adjacent to each other in the second direction.

8. The semiconductor device according to claim 7, wherein the plurality of first parts includes first parts having different widths in the second direction.

9. The semiconductor device according to claim 1, wherein a width of the upper wirings in the second direction is same as a width of the lower wiring in the second direction.

10. The semiconductor device according to claim 1, wherein a width of the upper wirings in the second direction is wider than a width of the lower wiring in the second direction.

11. The semiconductor device according to claim 1, wherein a width of the upper wirings in the second direction is 90% to 110% of a width of the lower wiring in the second direction.

12. The semiconductor device according to claim 1, wherein the first opening is provided in the lower wiring or provided so as to be sandwiched between the lower wirings in the second direction, and the second opening is provided in the upper wirings or provided so as to be sandwiched between the upper wirings in the second direction.

13. The semiconductor device according to claim 12,
wherein the first opening is provided at a position facing the upper wirings vertically, and
the second opening is provided at a position facing the lower wiring vertically.

14. The semiconductor device according to claim 1, wherein a width of the first or second opening in the second direction is one tenth or less of a width of the upper wirings in the second direction.

15. The semiconductor device according to claim 1, wherein a plurality of openings disposed in a two-dimensional array is provided as the first or second opening.

16. The semiconductor device according to claim 1, wherein, as the first or second opening, only one opening is provided in the upper wirings or in the lower wiring, or only one opening is provided so as to be sandwiched between the upper wirings in the second direction or between the parts of the lower wiring in the second direction.

17. The semiconductor device according to claim 1,
wherein the first substrate includes a semiconductor substrate including silicon (Si), and
the second substrate includes a semiconductor substrate including gallium (Ga) and arsenic (As).

18. A semiconductor device comprising:
a first substrate;
a lower wiring provided on the first substrate;
a plurality of upper wirings provided on the lower wiring via an insulation film; and
a second substrate provided on the upper wirings via a plurality of elements, wherein the upper wirings include a first wiring and a second wiring adjacent to each other in a first direction, the elements on the first wiring and the elements on the second wiring are connected in series to each other, a first opening is provided in the lower wiring or provided so as to be sandwiched between parts of the lower wiring in a second direction different from the first direction, and a second opening is provided in the upper wirings or provided so as to be sandwiched between the upper wirings in the second direction, a plurality of openings extending in the first direction is provided as the first opening, the lower wiring includes a plurality of first parts extending in the first direction and a plurality of second parts extending in the second direction, and each of the plurality of openings is provided between the first parts adjacent to each other in the second direction.

19. A semiconductor device comprising:

a first substrate;

a lower wiring provided on the first substrate;

a plurality of upper wirings provided on the lower wiring via an insulation film; and a second substrate provided on the upper wirings via a plurality of elements, wherein the upper wirings include a first wiring and a second wiring adjacent to each other in a first direction, the elements on the first wiring and the elements on the second wiring are connected in series to each other, a first opening is provided in the lower wiring or provided so as to be sandwiched between parts of the lower wiring in a second direction different from the first direction, and a second opening is provided in the upper wirings or provided so as to be sandwiched between the upper wirings in the second direction, a plurality of openings extending in the first direction is provided as the second openings, and each of the plurality of openings is provided between the upper wirings adjacent to each other in the second direction.

* * * * *